(12) United States Patent
Stevenson

(10) Patent No.: US 6,473,291 B1
(45) Date of Patent: Oct. 29, 2002

(54) LOW INDUCTANCE FOUR TERMINAL CAPACITOR LEAD FRAME

(75) Inventor: Robert A. Stevenson, Canyon Country, CA (US)

(73) Assignee: GB Aquisition Co., Inc., Clarence, NY (US)

(*) Notice: Subject to any disclaimer, the term of this patent is extended or adjusted under 35 U.S.C. 154(b) by 0 days.

(21) Appl. No.: 09/820,998
(22) Filed: Mar. 28, 2001

Related U.S. Application Data

(62) Division of application No. 09/396,652, filed on Sep. 15, 1999, now abandoned.
(60) Provisional application No. 60/124,632, filed on Mar. 16, 1999.

(51) Int. Cl.[7] .................. H01G 4/228; H01G 4/06; H01G 4/30
(52) U.S. Cl. .................. 361/306.3; 361/309; 361/311; 361/301.4
(58) Field of Search .................. 361/301.1–301.4, 361/302, 303, 304, 310–313, 306.1–306.3, 307, 308.1–308.3, 309, 321.1–321.3, 328–330, 807–810, 811, 782; 248/200; 439/73; 257/726–727

(56) References Cited

U.S. PATENT DOCUMENTS

| | | | |
|---|---|---|---|
| 2,756,375 A | | 7/1956 | Peck |
| 3,235,939 A | | 2/1966 | Rodriguez et al. |
| 3,444,436 A | * | 5/1969 | Coda .................. 361/773 |
| 3,920,888 A | | 11/1975 | Barr |
| 4,083,022 A | | 4/1978 | Nijman |
| 4,148,003 A | | 4/1979 | Colburn et al. |
| 4,152,540 A | | 5/1979 | Duncan et al. |
| 4,220,813 A | | 9/1980 | Kyle |
| 4,247,881 A | | 1/1981 | Coleman |
| 4,314,213 A | | 2/1982 | Wakino |
| 4,352,951 A | | 10/1982 | Kyle |
| 4,362,792 A | | 12/1982 | Bowsky et al. |
| 4,421,947 A | | 12/1983 | Kyle |
| 4,424,551 A | | 1/1984 | Stevenson et al. |
| 4,456,786 A | | 6/1984 | Kyle |
| 4,500,159 A | | 2/1985 | Briones et al. |
| 4,584,627 A | * | 4/1986 | Schilling et al. .................. 361/306 |
| 4,626,958 A | * | 12/1986 | Lockard et al. .................. 361/306 |
| 4,737,601 A | | 4/1988 | Gartzke |
| 4,741,710 A | | 5/1988 | Hogan et al. |

(List continued on next page.)

OTHER PUBLICATIONS

TDK Multilayer Ceramic chip capacitor application manual, internet search, pp. 42–55, no date.*
Article entitled "Carts '97"; published Mar. 24, 1997; sponsored by The Components Technology Institute, Inc.; 11 pages.

Primary Examiner—Dean A. Reichard
Assistant Examiner—Eric W. Thomas
(74) Attorney, Agent, or Firm—Kelly Bauersfeld Lowry & Kelley, LLP

(57) ABSTRACT

A chip capacitor is conductively coupled to spaced-apart (i.e., non-conductively coupled) circuit traces of an integrated circuit to provide a four terminal network. The chip capacitor includes a casing of dielectric material having first and second sets of electrode plates disposed therein, a first conductive lead frame which is conductively coupled to the first set of electrode plates, and a second conductive lead frame which is conductively coupled to the second set of electrode plates. The first and second lead frames are, in turn, conductively coupled to the circuit traces so as to route the output (or input) current of an electronic device through the capacitor.

7 Claims, 21 Drawing Sheets

U.S. PATENT DOCUMENTS

| | | | |
|---|---|---|---|
| 4,814,944 A | * 3/1989 | Sagawa et al. | 361/767 |
| 5,032,692 A | 7/1991 | DeVolder | |
| 5,053,916 A | * 10/1991 | Weekamp et al. | 361/308.2 |
| 5,070,605 A | 12/1991 | Daglow et al. | |
| 5,083,237 A | * 1/1992 | Tsuji | 361/765 |
| 5,122,929 A | * 6/1992 | Palanisamy et al. | 361/760 |
| 5,142,430 A | 8/1992 | Anthony | |
| 5,333,095 A | 7/1994 | Stevenson et al. | |
| 5,379,189 A | * 1/1995 | Merriman | 361/760 |
| 5,576,926 A | * 11/1996 | Monsorno | 361/303 |
| 5,620,476 A | 4/1997 | Truex et al. | |
| 5,650,759 A | 7/1997 | Hittman et al. | |

* cited by examiner

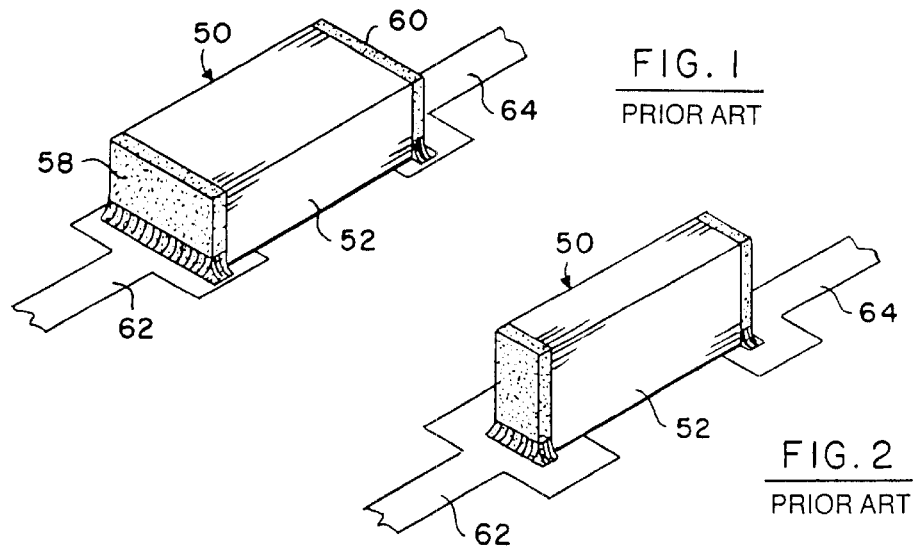
FIG. 1 PRIOR ART
FIG. 2 PRIOR ART
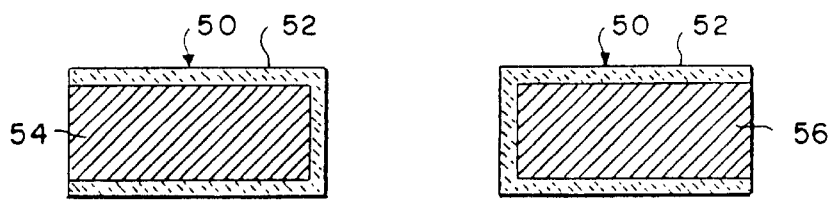
FIG. 3 PRIOR ART
FIG. 4 PRIOR ART
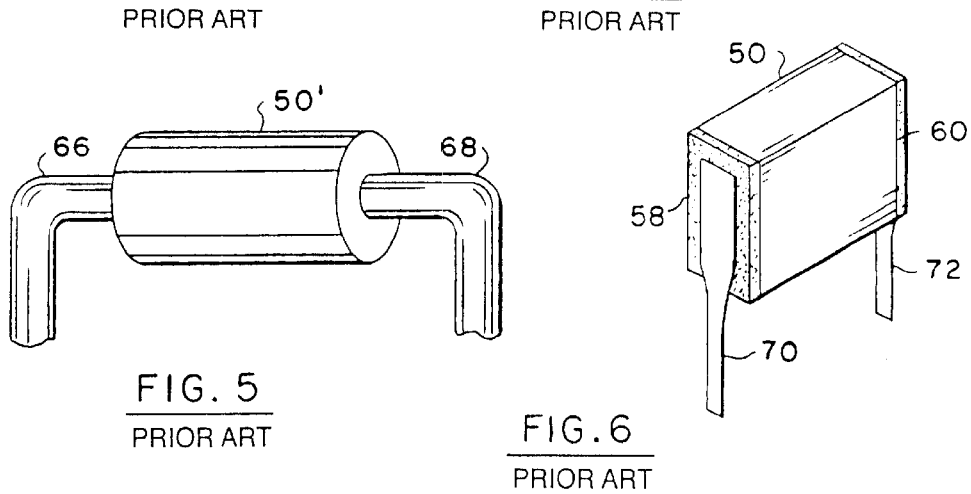
FIG. 5 PRIOR ART
FIG. 6 PRIOR ART FIG. 13
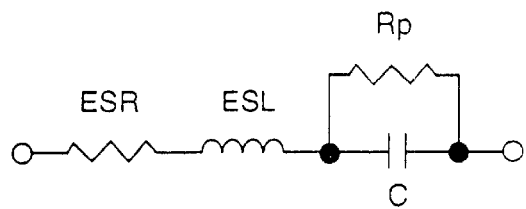
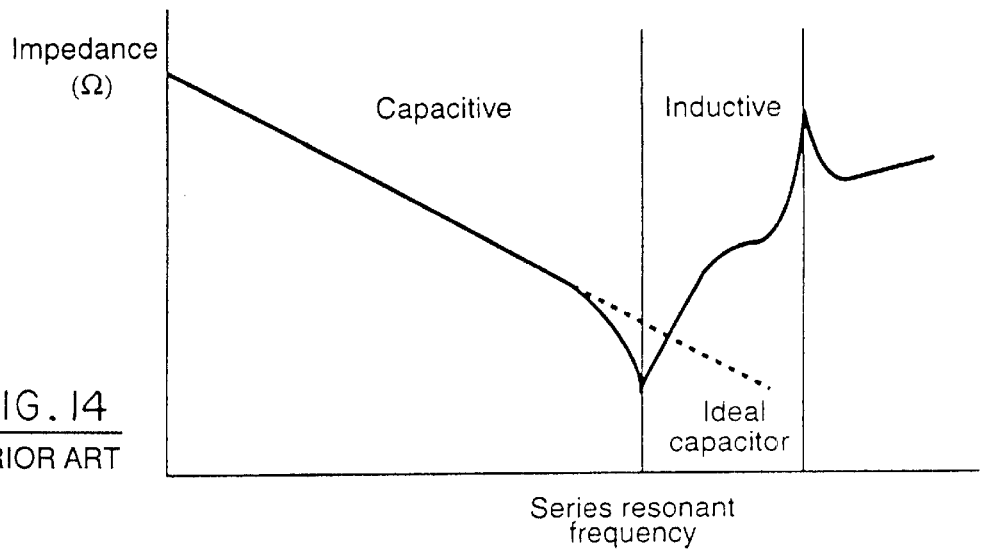
FIG. 14
PRIOR ART
FIG. 15
PRIOR ART
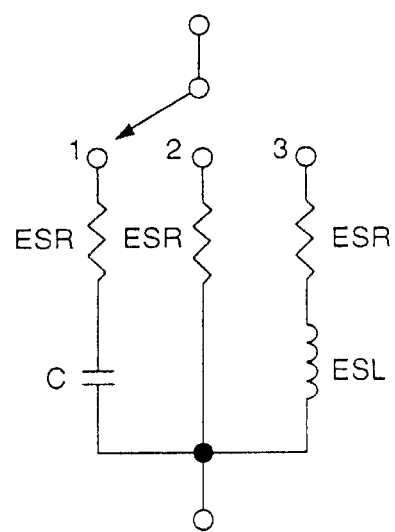
1 = BELOW RESONANCE
2 = AT RESONANCE
3 = ABOVE RESONANCE

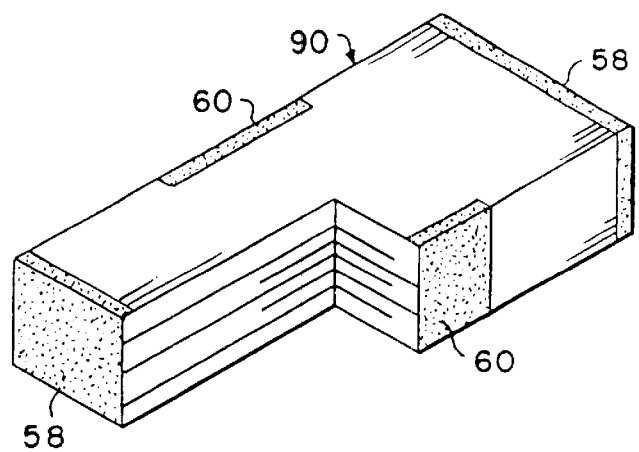
FIG. 19a
PRIOR ART
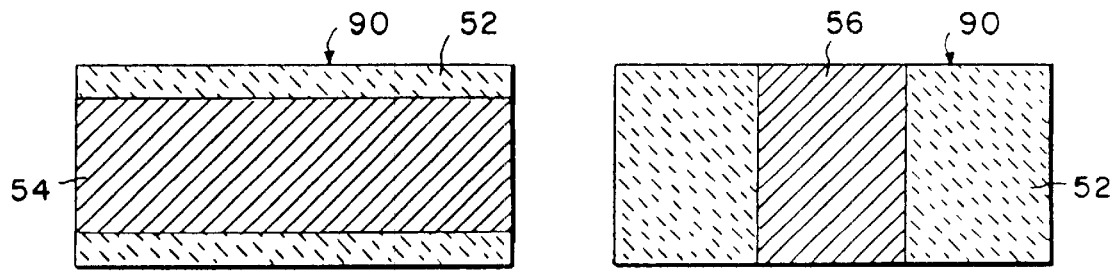
FIG. 19b
PRIOR ART
FIG. 19c
PRIOR ART
FIG. 20
PRIOR ART
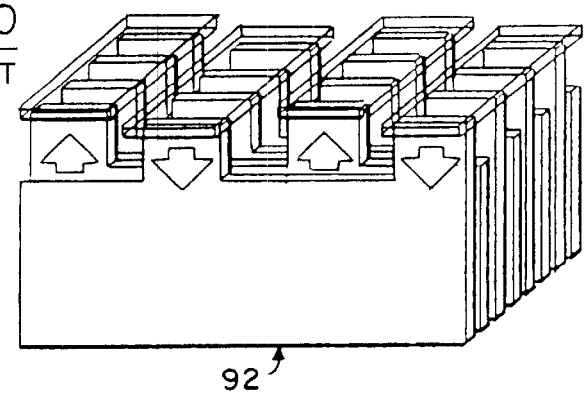

4 - TERMINAL LEADS

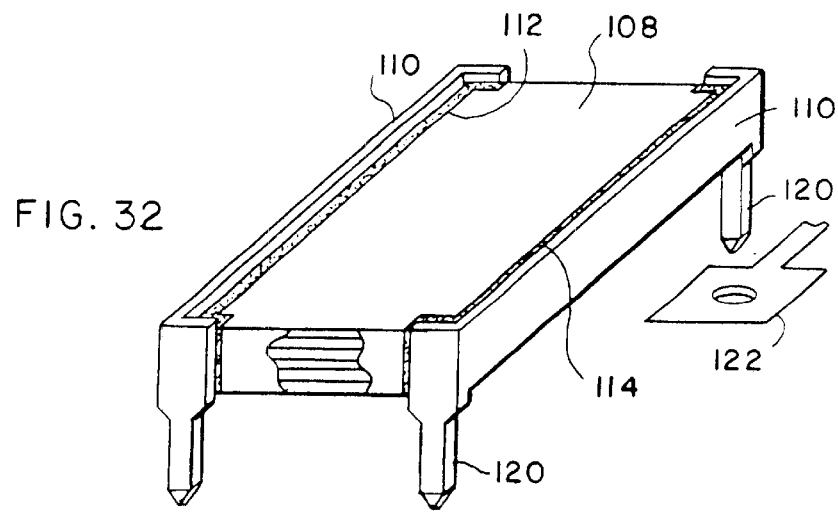
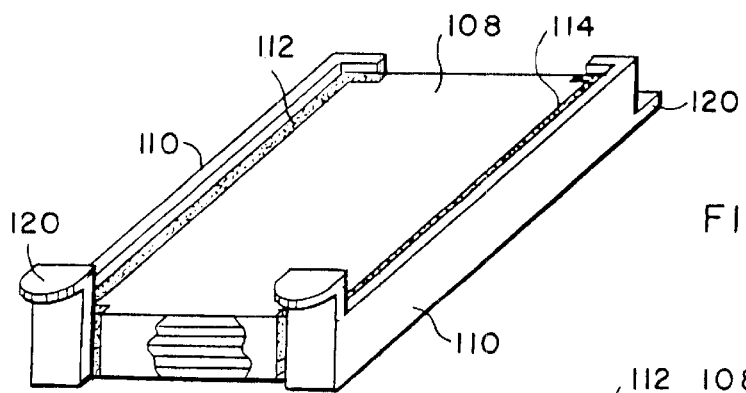
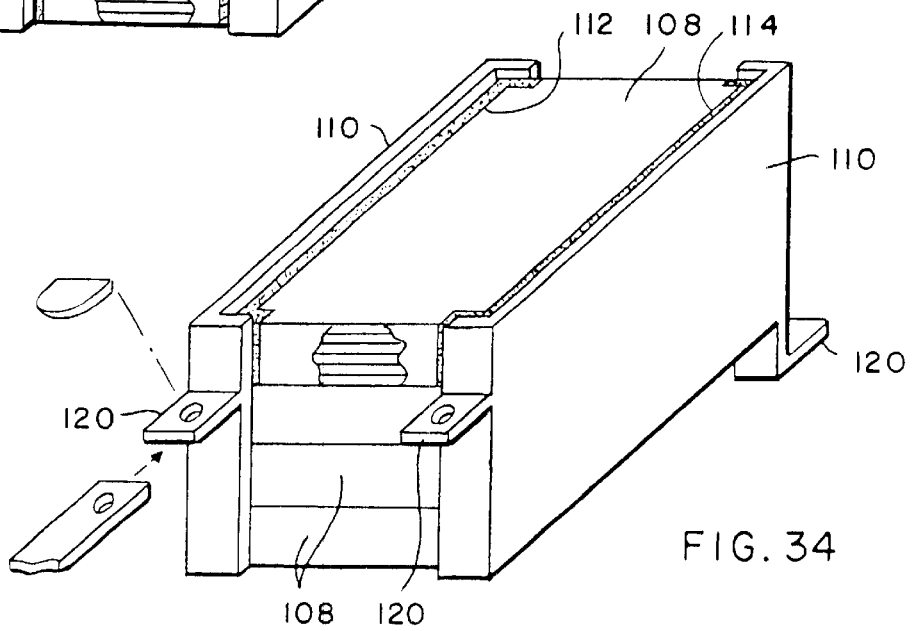

LOW INDUCTANCE FOUR TERMINAL CAPACITOR LEAD FRAME

This is division of application Ser. No. 09/396,652, filed Sep. 15, 1999, which claimed priority from Provisional Application No. 60/124,632, filed Mar. 16, 1999.

BACKGROUND OF THE INVENTION

This invention relates generally to chip capacitors having a four terminal capacitor lead frame, and related methods of construction. More specifically, the present invention relates to an improved capacitor lead frame design which acts as a transmission line that routes the output current or input current of an electronic device through the capacitor in a manner causing it to act as a four terminal network and further causing the capacitor equivalent series inductance (ESL) and capacitor equivalent series resistance (ESR) both to be dramatically reduced.

There are two primary ceramic capacitor geometries in common use in the industry—the rectangular chip and the feedthrough (often called a discoidal capacitor). The ceramic monolithic rectangular chip (MLC) capacitor (or "chip capacitor") is produced in very high commercial volumes in highly automated facilities. Over the years the cost of ceramic chip capacitors has dropped a great deal. It is now common to purchase certain value chip capacitors for only a few pennies. The ceramic feedthrough capacitor is only produced in a small fraction of the chip capacitor volume. Accordingly, feedthrough capacitor production has not been nearly as automated. In addition, the feedthrough capacitor is inherently more expensive to produce due to drilling and centering the through hole, tighter dimensional control, reduced volumetric efficiency and difficulty in automating the manufacturing process. Typically the cost of a particular value chip capacitor is ten to twenty percent of the cost of an equivalent value discoidal feedthrough capacitor.

FIGS. 1 and 2 illustrate prior art conventional MLC chip capacitors 50 with flat and tombstone mounting. The chip capacitors 50 are of standard construction, including a ceramic dielectric 52 that has disposed therein alternating lay up patterns for a first set of electrode plates 54 and a second set of electrode plates 56 separated by the ceramic dielectric 52 (FIGS. 3 and 4). The first set of electrode plates 54 terminate in a first metallization band 58 exposed at one end of the chip capacitor 50, and the second set of electrode plates 56 is conductively coupled to a second metallization band 60 disposed at an opposite end of the chip capacitor 50.The chip capacitors 50 act as two terminal devices. That is, they are connected from one circuit trace 62 to another circuit trace 64 or from a circuit trace to ground in order to decouple or filter signals from one line to a reference point. In the embodiments of FIGS. 1 and 2, the metallization bands 58 and 60 are soldered or otherwise conductively coupled to pads for the circuit traces 62 and 64 as shown.

FIG. 5 illustrates a typical prior art cylindrical chip-type capacitor 50' having axial leads 66 and 68. FIG. 6 illustrates a typical prior art chip capacitor 50 having radial leads 70 and 72 extending from the metallization bands 58 and 60.

It has become common practice to use assembled stacks of monolithic ceramic capacitors 50 which form either vertical or horizontal capacitor arrays 74. These are typically installed with a lead frame 76 as shown in FIGS. 7–9. A multiplicity of capacitors 50 are typically stacked up in order the equivalent series resistance (ESR) and also the equivalent series inductance (ESL) of the device. As shown in FIG. 8, the lead frame 76 for the capacitor array 74 includes a lead form 78 for stress relief adjacent to the top ends of mounting feet. An optional outer case 82 may be provided over the array 74 and secured in place by means of an epoxy backfill 84. An equivalent circuit model of generic two terminal capacitor devices as discussed above is shown in FIG. 10. Any of these prior art capacitors may be conformally coated, epoxy encapsulated or enclosed in a mounting case as discussed above.

Why Is Inductance Important?

The inductive properties of capacitors in electronic circuits is becoming increasingly important. As important as these properties are now, it is expected that inductive properties will be even more important as operating speeds increase, active device packaging densities increase, and frequencies of application continue to rise. All other things being equal, device power increases with the square of the frequency. In addition, as active devices increase in complexity, the pin count for power distribution and grounding increases. As the number of pins increase, the total lead length and thus associated inductances increase, requiring the increased use of decoupling capacitors to handle system issues associated with the greater inductance. As early as the mid 1980 s, bypass applications of capacitors were estimated to be up to 85% of the U.S. capacitor market (Rappaport, Andy, "Capacitors, " Electronic Design News, Vol. 27 (20), Oct. 13, 1982, pp. 104–113, 115–116, 118). This percentage has likely increased.

Following are examples of some capacitor applications where capacitor equivalent series inductance (ESL) is very important:

1. Low ESL/Low ESR capacitors are increasingly needed as ripple current filters in the inputs and/or outputs of switch mode power supplies (SMPS), buck regulators, power converters and DC to DC converters. The switching frequency of such devices has been increasing over the last ten years which improves their efficiency and packaging density.

2. Low inductance capacitors are needed to match the fast turn-on/off times of silicon-controlled rectifiers, used in a variety of equipment, including: railway signaling units, spike suppression circuitry, power supply filters, and motor control equipment.

3. Capacitors are used to reduce the "Delta-I" noise in high speed computers (Chen, Howard C. and Schuster, Stanley E., "On-Chip Decoupling Capacitor Optimization for High Performance VLSI Design," *Proceedings. VLSI Tech Systems Applications Conference*, 1995, pp. 99–103; Travis, Bill, "Use Local Bypass Capacitors to Meet Rigorous High-Speed-System Demands," EDN [European Edition], Vol. 40 (1), Jan. 5, 1995, pp. 63–66, 68, 70; Martin, Arch G., "Multilayer Ceramic Capacitors Beat the Inductance Blues," Electronic Design, Vol. 29 (11), May 28, 1981, pp. 99–102.). In a bypass application, decoupling capacitors are added a) to reduce switching noise between the power supply and the IC input/output (I/O) buffers, b) to reduce voltage drops across the power supply caused by interconnect inductances, and c) to reduce radiated EMI noise.

The amount of induced EMF can be given by the equation:

Induced EMF=L (di/dt)

To reduce the total EMF, one approach is to reduce inductance. This is usually accomplished first by attempting to put decoupling capacitors on the substrate itself in parallel with current-carrying conductors on the microprocessor. This approach is often not feasible which leads to the addition of one or more decoupling chips to be put nearby. This alternative may require signal fan-out connections on the surface of the module. This allows the uppermost internal layers to be dedicated to capacitor-to-chip power connections to reduce switching noise that occurs when many drivers on the IC switch simultaneously. Excessive switching noise can cause both signal delays and possible false switching of adjacent logic gates. The capacitors act as local, temporarily independent energy sources to refresh or switch logic gates.

There are two applications here in reality: a) main supply-line bypass applications to reduce fluctuations caused by amps of power switching through supply-line inductances, and b) local integrated circuit (IC) bypass applications where capacitors are mounted very near ICs or blocks of ICs to reduce fluctuations caused by very fast, local current wave fronts.

4. Radio frequency applications include EMI filters, resonant circuits, matching networks, and a number of coupling/decoupling uses. One specific application is the use of capacitors in resonant converters of high voltage power supplies for traveling wave tubes. Another is the use of capacitors [and their inductive properties] to help "trim" circuits.
  5. High voltage power supplies, especially those with resonant converters, have high transformation ratios with many turns for secondary windings that induce high leakage inductance. Additional capacitor inductance must be minimized in order to minimize total system inductance and thus improve power usage factors and system efficiency.
  6. The inductance of capacitors can be critical in capacitor-run and capacitor-start, single-phase and multi-phase motor applications. Shunt capacitors located across the terminals of stator windings in induction motors is one specific application. Other applications include circuits where capacitors are connected directly to the load-side of selected motor-starters in machine tool drives or capacitors in capacitor-start, single-phase, AC motors.
  7. Inductance is also very important where capacitors act as energy sources for sudden energy discharges for systems, such as magnetic-pulse metal processing equipment, electromagnetic launchers, railguns, pulse welding equipmgent, pulse forming circuits, and magnetic pulse compressors (Konotop, V. V., "Low-lnductance Capacitor," University of California Lawrence Radiation Lab, Translation, UCRL-TRANS-1273/L, 1965.).
  8. Electricity generating agencies may mandate or provide incentives to improve the power factors of facilities or equipment (particularly overseas). A preferred approach is to install power factor correction capacitors to decrease reactive current. Installing such capacitors on equipment such as arc welders and arc furnaces requires parts with a minimum equivalent series inductance (Baroda, Anonymous, Devki R & D Engineers, "Selection and Application of Capacitors," Electricity Conservation Quarterly, Vol. 10 (2), October 1989, pp. 3–6, 9.).

What Is The Inductance Of A Capacitor?

The equivalent series inductance (ESL) of the capacitor is usually thought to be an undesirable or "parasitic" property (however, in rare circuit timing applications the ESL is made use of). To understand inductance we must first discuss the simplified equivalent circuit model of a capacitor that is shown in FIG. 10 (a more complete model is shown in FIG. 13). This model consists of an ideal capacitor in series with an ESL and an equivalent series resistance (ESR). There is also a parallel resistance (not shown) due to the capacitors dielectric conductance. For this discussion, we shall ignore the capacitor's insulation resistance (IR). This is because the typical IR (another parallel resistance) of modern capacitors is many hundreds of megohms or greater which does not significantly contribute to the operating impedance of the capacitor.

The capacitor's impedance, Z, resonant frequency, ESL and ESR are defined by the following equations:

$$X_c = \frac{-j}{2\pi f C} = \frac{-j}{\omega C}$$

$$X_L = +j2\pi f L = +j\omega L$$

$$SRF = \frac{1}{2\pi \sqrt{LC}}$$

$$Z = \sqrt{(ESR)^2 + (X_L - X_C)^2}$$

Where:
ω=the radian frequency
f=frequency in hertz
C=capacitance in farads
L=inductance (ESL) in henries
$X_c$=capacitive reactance in ohms
$X_L$=inductive reactance in ohms
SRF=capacitor self resonant frequency in hertz.
Z=capacitor impedance in ohms As can be seen, Z varies with frequency and reaches a minimum at the self-resonant frequency (SRF). Because it is such an important aspect of the capacitor's impedance, we shall discuss ESR briefly before moving on to ESL. FIG. 11 is a vector diagram with real and imaginary axes which illustrates the relationship between the inductive and capacitor reactance, and the phase angle between the impedance and the real axis (ESR).

Equivalent Series Resistance (ESR)

The ESR of the capacitor is a lumped resistance parameter, which consists of many complicated elements. For a capacitor operating at low frequencies (such as 1 kHz) this resistance is a function of the dielectric loss tangent which is usually expressed as dissipation factor (DF). The ESR is also a function of ohmic losses due to connections, electrode material, electrode cross sectional area, leads, terminations, etc. At higher frequencies, skin effect plays an important role and can dominate ESR and the capacitor's impedance.

For a given dielectric material, the capacitor designer actually can do very little to affect the DF (DF is primarily a property of the dielectric material selected). However, the designer can do a lot to control ESR, including selecting a specific capacitor form factor, electrode count, cross-sectional area and metallurgical quality of connections, and electrode and lead materials. ESR is generally considered an undesirable property which causes circuit power loss due to heat dissipation, raises the impedance, or affects the circuit time constant (t), thereby increasing capacitor charge-discharge time. The capacitor ESR is a function of frequency as illustrated in FIG. 12. (Ennis, J., "Cautions About the Use of Equivalent Series Resistance (ESR) in Specifying Capacitors," *Proceedings. 13th Capacitor and Resistor Technology Symposium* (CARTS '93), Costa Mesa, Calif., March 1993, pp. 58–64.).

The Effect Of ESL On The Capacitor's Impedance

For by-pass, EMI filter and RF coupling applications it is desirable for the capacitor's impedance to be as low as possible. As a first step, the designer selects a high enough capacitance value so that the capacitive reactance will be very low at the frequencies of interest (in many cases close to zero ohms). In these cases, the impedance of the capacitor at operating frequencies is usually dominated by a combination of ESR and the inductive reactance due to ESL operating in series. FIG. 13 gives a more complete capacitor equivalent circuit which includes the dielectric conductance. Impedance, reactance, and resonance equations for this more complex capacitor model are provided by J. A. Sunda in his 1982 paper entitled "Miniature Decoupling Capacitors for HF Applications (Sunda, J. A., "Miniature Decoupling Capacitors for HF Applications," Australian Electronics Engineering Vol. 15, No. 7, Australia, July 1982, pp. 56–64.). As previously mentioned, the dielectric conductance is so low (IR is high) that the capacitor equivalent model illustrated in FIG. 10 is suitable for most prior art capacitor applications.

The Prior Art Capacitor At And Near Resonance

The simplified circuit model of the prior art capacitors shown in FIGS. 1–9 is a series circuit consisting of an R, L, and C. This means that there is a frequency at which $+jX_L$ and $-jXc$ are of equal values in ohms. This is known as the capacitor's self-resonant frequency (SRF), where the total impedance is at a minimum and is equal to the ESR. FIG. 14 is a graph of a typical impedance vs. frequency curve for a generic prior art capacitor. The solid line represents prior art capacitors. The ideal curve is illustrated by the dashed line. As can be seen, the impedance of the capacitor drops dramatically at the SRF.

There is also a reversal in the phase shift as the capacitor below resonance switches from capacitive behavior to inductive behavior above resonance. When this type of capacitor is used in an EMI filter application it is interesting to note that the insertion loss in dB reaches a maximum at the SRF. This is because the impedance of the capacitor is trying to go to 0Ω at the SRF (the capacitor ESR prevents this).

At operating frequencies below the resonant frequency, the impedance of the capacitor appears capacitive with a phase shift wherein the current leads the voltage (if not for ESR, the current would lead the voltage by 90 degrees). At frequencies above resonance, the capacitor impedance appears increasingly inductive with a corresponding lag of the current relative to the voltage. At frequencies well above resonance, the capacitor impedance is completely dominated by inductive reactance which defeats the capacitor's purpose in by-pass, EMI filtering, or RF coupling applications. Accordingly, knowing the capacitor SRF is a very important circuit design parameter.

FIG. 15, illustrates a prior art capacitor simplified equivalent circuit and a test model with a switch which was inspired from a paper by L. L. Macomber (Macomber, Laird, "Ripple/EMI Performance," Electron, May 22, 1979, pp. 15–18). Below the self resonant frequency, the prior art capacitor model is a capacitor in series with the ESR. At resonance, the capacitor model is a resistor (the ESR). Above resonance, the capacitor acts as an inductor in series with the ESR.

Low ESL Prior Art Capacitor Designs

The inductance of a conventionally manufactured capacitor is primarily a function of the magnetic loop area formed, for example, from lead to lead through the capacitor active area itself. The loop area (which determines ESL) is greatly affected by capacitor form factor and connections. For example, as shown in FIGS. 16a and 16b, a multilayer ceramic capacitor (MLC) chip 50 that is terminated along its opposite long sides with a narrow cross section (FIG. 16a) will have much lower ESL and ESR than a chip capacitor of equal value which is long and terminated on its short ends (FIG. 16b). The addition of leads or a frame lead 76 to a chip tends to increase ESL and ESR. Some prior art lead frame designs, however, are more efficient than others.

Table 1 is condensed from a study by Boser and Newsome which consisted of precise impedance measurements of side terminated vs. end terminated size 0805 MLC chip capacitors (Boser, Otmar and Newsome, Vernon, "High Frequency Behavior of Ceramic Multilayer Capacitors," *IEEE Transactions on Components, Hybrids, and Manufacturing Technology*, Vol. CHMT-10 (3), September 1987, pp. 437–439). Of particular interest in this study are the significantly higher ESL values obtained for all of the end terminated configurations. A review of the data also indicates that the inductance varies very little with dielectric type or capacitance value. In general, MLC capacitors tend to have lower ESL than other technologies. This is due to the relatively high dielectric constant of ceramic capacitors and efficient electrode geometry. Chip (stack) plastic capacitors also have efficient electrode geometry and tend to be lower in ESL than wound capacitors. Because of the high dielectric constant, an MLC capacitor will be smaller in size for a given capacitance value than other technologies. The smaller size results in a significant reduction in ESL.

Form factor (length to width ratio) is also critical for low inductance and low ESR designs in both ceramic and plastic chip capacitors. Electrode alignment quality also affects chip ESL. Manufacturing methods, such as die punching and compaction, that result in greater accuracy of electrode alignment in the finished chip appear to reduce total chip inductance.

TABLE 1

Test Results for Side and End Terminated 0805 Chip Capacitors:

| Side Terminated | Cap (nF) @ 1 kHz | DF (%) @ 1 kHz | Resonant Freq. (MHz) | Inductance (nH) @ 0.3 to 1.0 GHz |
| --- | --- | --- | --- | --- |
| Z5U | 5.3 | 1.5 | 83 | 0.8 |
| Z5U | 75 | 1.8 | 18 | 0.8 |
| Z5U | 86 | 4.0 | 21 | 0.8 |
| X7R | 2.4 | 1.3 | 110 | 0.8 |
| X7R | 2.5 | 1.3 | 110 | 0.8 |
| X7R | 35 | 1.4 | 32 | 0.9 |
| NPO | 0.04 | 0 | 759 | 0.4 |
| NPO | 0.6 | 0 | 219 | 0.6 |
| NPO | 0.6 | 0 | 219 | 0.7 |

| End Terminated | Cap (nF) @ 1 kHz | DF (%) @ 1 kHz | Resonant Freq. (MHz) | Inductance (nH) @ 0.3 GHz |
| --- | --- | --- | --- | --- |
| Z5U | 10.0 | 2.0 | 42 | 1.5 |
| Z5U | 43 | 2.1 | 24 | 1.3 |
| Z5U | 50 | 2.6 | 21 | 1.3 |
| X7R | 2.8 | 1.1 | 83 | 1.4 |
| X7R | 20.5 | 1.6 | 32 | 1.2 |
| X7R | 21.5 | 1.4 | 32 | 1.2 |
| NPO | 0.05 | 0 | 660 | 0.8 |
| NPO | 0.6 | 0 | 190 | 1.0 |
| NPO | 0.6 | 0 | 190 | 1.0 |

FIGS. 17 and 18 illustrate prior art feedthrough capacitors 86 and 88. Feedthrough capacitors are very low inductance devices which cannot be modeled with lumped parameters. They are best modeled as a transmission line and exhibit excellent high frequency performance. However, feedthrough capacitors are designed to be mounted on a bulkhead, terminal or housing, therefore, they are not suitable for most substrate or circuit board mounting applications.

FIGS. 19a–19c illustrate a prior art flat-thru style capacitor 90. Flat-thru capacitors 90 are also very low inductance devices which cannot be modeled with lumped parameters. As for feedthrough capacitors 86 and 88, they are best modeled as a transmission line and also exhibit excellent high frequency performance. Flat-thru capacitors 90 are well suited for substrate or circuit board mounting, however, they are very limited in the amount of current that they can handle. This is because the circuit current must pass entirely through the electrodes themselves which are thin and lacy. In general, the flat-thru design is not used in high current applications, such as the output circuitry of a SMPS because of these current limitations.

Discussion Of Prior Art Capacitor Circuit Installation

For all capacitor technologies, leads and circuit layout contribute greatly to ESL by increasing the overall magnetic loop area. Correspondingly, wire-bonded connections tend to introduce much more inductance than soldered or conductive epoxy-bonded land connections.

The contribution to inductance from leads and wire-bonded connections can be estimated from the equation for the inductance of a straight round wire (Breed, Gary A., "Capacitor Behavior at Radio Frequencies," *RF Design*. Vol. 19 (1), January 1996, pp. 58–61).

$$L=0.0002b[\ln(2b/a)-0.75]$$

Where L is the inductance in $\mu$H, a is the wire radius in mm, and b is the wire length in mm.

For example: a ¼ inch (6.3 mm) length of #20 AWG (0.8 mm) wire has an inductance of 3.4 nH (Breed, Gary A., "Capacitor Behavior at Radio Frequencies," *RF Design*, Vol. 19 (1), January 1996, pp. 58–61.).

In actual practice, when leads are in close proximity to other circuit's elements, a more complex analysis may be required. An approximate guideline for leaded parts has been offered by Harrop (Harrop, P. J., "Radio Frequency Capacitors," Electron, No. 68, 13, Feb. 1975, pp. 56, 58, 61.) who states that radial leaded capacitors are limited to applications of 10 MHz or below. This is due to their relatively short leads, while axial leaded parts are limited to 5 MHZ because their leads must have a right angle bend for PWA mounting and are, therefore, double the length.

Multiple bus bar or multiple tab designs significantly reduce ESL. Tabs, or bus bars, have lower inductance than wires due to their width. Multiple tabs reduce electrode displacement current density which reduces capacitor internal inductance. Four terminal designs eliminate the effect of tab inductance (Macomber, Laird, "Ripple/EMI Performance," Electron, May 22, 1979, pp. 15–18.). FIG. 20 and FIGS. 21a–21d illustrate prior art capacitor designs which reduce ESL. For example, conventionally designed Al-electrolytic capacitors exhibit ESL in the nanohenry range; whereas, 4-terminal designs (see Table 2) exhibit ESL in the microhenry range (Macomber, Laird, "Ripple/EMI Performance," Electron, May 22, 1979, pp. 15–18). As previously mentioned, capacitor ESL (and ESR) is primary a funtion of capacitor design and construction. Selection of dielectric and electrode materials is usually a much smaller effect.

FIG. 20 shows a cross section of a prior art Low Inductance Capacitors Array (LICA) capacitor 92 (arrows show direction of electrode displacement currents) (Galvagni, John, et al., "So Many Electrons, So Little Time . . . ," *Proceedings, 44th Electronic Components and Technology Conference*, 1994, pp. 234–238.).

FIGS. 21a–21d show how proper tab construction can reduce ESL in Al-electrolytic capacitors 94 (Macomber, Laird, "Ripple/EMI Performance," Electron, May 22, 1979, pp. 15–18).

Table 2. ESL vs. Al Construction Style

| Capacitor Construction | Typical ESL |
| --- | --- |
| 4-Terminal | 0.5 nH |
| Stacked Foil | 15 nH |
| Miniature, Single-Ended | 7 nH |
| Intermed, Single-Ended | 12 nH |
| Miniature, Axial | 12 nH |
| Multitab, Computer Grade | 15 nH |

H. Vetter, (Vetter, Harold, "High-Performance Capacitors for Low-Inductance Circuits," *Siemens Components, Vol 25* (3), 1990, pp. 81–85. Also in *Proceedings, 22nd International Power Conversion Conference* (PCIM), 1991, Europe, pp. 141–148.), points out a number of other construction details in Al foil capacitors (and other-wound paper and metallized capacitors) that directly affect inductance as well as tab designs. Having multiple, large-area connections to thick electrode foils, coaxial winding of electrodes in separate layers, controlling the capacitor height/width ratio and use of cylindrical vs. circular cross-sectional areas, will all affect inductance.

Discrete component location in integrated components, such as filters, temperature-compensated oscillator circuits and delay lines also affects ESL. Proper location and mounting configuration of capacitors and magnetic components with respect to each other and to substrate metallization patterns will reduce total device ESL.

Capacitor design optimization should be matched with circuit layout optimization. Schaper and Morcan, (Schaper, Leonard W. and Morcan, Gabriel, "High Frequency Characteristics of MCM Decoupling Capacitors," *Proceedings, 46th Electronic Components and Technology Conference*, Las Vegas, Nev., 1996, pp. 358–364.), provide the following inductance values for surface mount technology connections:

short wirebond ~1 nH solder bumps and pedestals ~0.05 nH

PC traces ~10 nH/inch[1]

A comparison of interconnection techniques, including wire bonding, Tape Automated Bonding, and gold bump bonding, with respect to their relative inductance is provided by Galvagni and co-authors (Galvagni, John, et al., "So Many Electrons, So Little Time . . . ," *Proceedings, 44th Electronic Components and Technology Conference*, 1994, pp. 234–238.).

Ceramic capacitors are particularly appropriate for low ESL applications because of their high unit capacitance provided in a small size combined with robust construction. The high dielectric constant of ceramic capacitors reduces their volume, which also tends to reduce the ESL and ESR.

Ceramic capacitors are typically constructed by interleaving nonconductive layers of high dielectric constant ceramic material with metallic electrodes. The metallic electrodes are typically "layed-down" on the green ceramic material by silk screening processes. The device is then fired (sintered) to form a rugged monolithic structure (the "capacitor"). Monolithic ceramic capacitors are well known in the art for a variety of applications in both surface mount (chip capacitor) and leaded applications. Also well known in the art are stacked film capacitors, which are constructed in a very similar manner to ceramic chip capacitors. Layers of film dielectric are interleaved with conductive electrodes, thereby forming a chip-type capacitor. Tantalum, aluminum electrolytic or wound/stacked film capacitors are generally not as low in ESL and ESR as a ceramic capacitor since they tend to be larger due to their lower dielectric constant.

Capacitor manufacturers have come up with many novel designs to reduce inductance. However, these designs have involved methods of making multiple attachments to the electrodes so that the interconnection inductances are reduced or the interconnection resistance is reduced.

FIGS. 22 and 23 illustrate use of a typical capacitor array 74 similar to that illustrated in FIGS. 7 and 8, as utilized in connection with a switch mode power supply (SMPS) 96. The exemplary SMPS 96 of FIG. 22 includes a housing 98 in which a circuit board 100 is placed. An AC plug 102 is accessible through the housing 98 and provides power to the components mounted on the circuit board 100. The capacitor array 74 is conductively coupled to circuit traces 104 which extend to output terminals 106. FIG. 23 illustrates how the circuit model (FIG. 10) of the capacitor array 74 extends between the circuit traces 104 intermediate the primary components of the switch mode power supply 96 and the output terminals 106.

In view of all of the foregoing, it is clear that there is a need for an improved capacitor design which dramatically reduces the inductance and ESR of the device, thereby improving its high frequency performance. Further, an improved capacitor design is needed which is particularly suited to the type of monolithic ceramic stacked capacitors that are used in surface mount power supplies, buck regulators and DC to DC converters to control output ripple current. Moreover, an improved capacitor design is needed which is capable of routing circuit current past the capacitor's inductance such that it is no longer in series. This would result in a dramatic improvement in the bypassing or attenuation of high frequency ripple or fast rise time pulses. The present invention fulfills these needs and provides other related advantages

SUMMARY OF THE INVENTION

The present invention resides in a novel capacitor transmission line lead frame which incorporates a unique configuration that routes the output (or input) current of an electronic device through the capacitor. This technique turns the capacitor from a two terminal device into a four terminal network, which acts as a transmission line. This has the effect of dramatically reducing the capacitor inductance (ESL) and is also very effective in reducing ESR. In addition, the novel transmission line lead frame is particularly suited for surface mounting or through hole mounting so that it is compatible with other component installation techniques. Another advantage of the invention is that low cost, high volume chip capacitors which are well known in the art, are readily adaptable to mounting with this lead frame approach. This results in substantial cost savings over other transmission line style capacitors, for example feedthrough capacitor technology.

More particularly, the present invention resides in a capacitor which comprises a casing of dielectric material having first and second sets of electrode plates disposed therein, a first conductive lead frame conductively coupled to the first set of electrode plates, and a second conductive lead frame conductively coupled to the second set of electrode plates. The first conductive lead frame includes a first connector which is attachable to a first circuit trace of an integrated circuit and second connector attachable to a second circuit trace of the integrated circuit such that the first conductive lead frame conductively couples the first circuit trace to the second circuit trace. The second conductive lead frame includes a first connector attachable to a third circuit trace of the integrated circuit and a second connector attachable to a fourth circuit trace of the integrated circuit such that the second conductive lead frame conductively couples the third circuit trace to the fourth circuit trace.

Typically a first metallization band is disposed along one side of the casing and is conductively coupled to the first set of electrode plates. Similarly, a second metallization band is disposed along another side of the casing and is conductively coupled to the second set of electrode plates. In several of the illustrated embodiments herein, the first and second lead frames are conductively coupled to, respectively, the first and second metallization bands. However, the first and second metallization bands may form, respectively, the first and second lead frames themselves.

The advantages of the novel capacitor transmission lead frame include: A) complete reduction or elimination of the capacitor external inductance due to leads and connection techniques (a small amount of capacitor internal inductance is all that remains); B) reduction in ESR due to the efficient electrode geometry and method of routing circuit input (or output) current through the capacitor; C) greatly improved RF performance at high frequency (the transmission line style lead frame is particularly effective for controlling the ripple effect of high frequency switch mode power supplies, or other high frequency applications); D) a significantly increased capacitor self resonant frequency (SRF); and E) the unique configurations of the capacitor transmission line lead frame gives a designer the ability to place the capacitor at strategic locations on a substrate near the point of lead ingress or egress. This latter point is particularly important when said chips are mounted at a distance from the shield can or housing or point of entry, point of ingress or egress from an electronic device. High frequency ripple or noise can couple across some of said components and recouple to other parts of the circuit.

A feature of the invention is that the input or output current of the electronic circuit or device must pass through the lead frame itself. This is very unlike a conventional capacitor, which conducts no current (other than charging current) in a DC circuit application, or conducts only capacitor reactive current in an AC application. Since the novel capacitor lead frame as described herein turns the chip capacitor into a four terminal device the lead frame must carry the entire circuit current. Accordingly, the lead frame must be sized as to thickness, length, and width so as to carry the output current or input current without overheating or fusing.

The novel transmission line style lead frame of the present invention can be constructed of a variety of conductive materials including copper, brass, plated steel, aluminum, and other metals. The designer also has a wide choice of finishes or platings or surface finishes. Typical examples would be nickel and electro-tin plating, silver plating, hot solder dipping, or gold plating. A wide variety of mounting tabs are possible (a few have been illustrated in the accompanying drawings). It will be obvious to one skilled in the art that mounting tabs can be constructed for mounting to a substrate by through hole soldering, surface mounting by soldering or conductive thermal setting adhesives, wire-bonding, mounting by screws or fasteners or by welding, or the like.

The method of attachment between the capacitor and the lead frame can also be accomplished through with a variety of materials and construction techniques. Monolithic ceramic capacitors are typically terminated with either a silver or palladium silver bearing glass frit which is fired onto the capacitor (there are alternative terminations including plated nickel, gold, etc.). The capacitor terminations connect the internal electrode plates in parallel and also provide a solderable electrically conductive finish for lead attachment. Accordingly, leads may be attached by solder, conductive adhesives, or other electrical bonding techniques. In a similar manner, film capacitors which are stacked as chips are typically terminated by spraying babbitt or other conductive material to connect their internal electrode plate sets in parallel. Accordingly, the transmission line style lead frame can be attached in the same manner as previously described for the monolithic ceramic capacitor.

Other features and advantages of the present invention will become apparent from the following more detailed description, taken in conjunction with the accompanying drawings which illustrate, by way of example, the principles of the invention.

BRIEF DESCRIPTION OF THE DRAWINGS

The accompanying drawings illustrate the invention. In such drawings:

FIG. 1 is a perspective view of a prior art conventional chip capacitor which is flat-mounted to circuit traces;

FIG. 2 is a perspective view of a prior art conventional chip capacitor similar to that illustrated in FIG. 1, illustrating tombstone mounting of the capacitor to circuit traces;

FIG. 3 is an exemplary horizontal section taken through the chip capacitor of FIG. 1, illustrating the configuration of a first set of electrode plates therein;

FIG. 4 is a horizontal section similar to FIG. 3, illustrating the configuration of a second set of electrode plates;

FIG. 5 is a perspective view of a prior art capacitor having axial leads;

FIG. 6 is a perspective view of a prior art chip capacitor having radial leads;

FIG. 13 illustrates a complex prior art capacitor equivalent circuit;

FIG. 14 is a graph showing a typical prior art capacitor impedance versus frequency curve;

FIG. 15 illustrates a prior art capacitor equivalent circuit below, at, and above its self resonant frequency;

FIG. 19a is a partially sectional perspective view of a prior art flat-through style capacitor;

FIG. 19b is a horizontal section taken through the flat-through style capacitor of FIG. 19a, illustrating the configuration of a first set of electrode A plates therein;

FIG. 19c is a horizontal section similar to that illustrated in FIG. 19b, illustrating the configuration of a second set of electrode plates within the flat-through style capacitor of FIG. 19a;

FIG. 20 is a schematic representation of a prior art low inductance capacitors array (LICA) capacitor, wherein the arrows show the direction of electrode displacement currents;

FIG. 32 is another embodiment of a single horizontal chip capacitor having the novel four terminal transmission line lead frame in accordance with the present invention, illustrating yet another manner in which the lead frame may be constructed for through-hole mounting into a circuit board;

FIG. 33 is a perspective view of yet another embodiment lead frame for use in connection with a single chip capacitor, including mounting tabs modified so that their height can be adjusted for convenient alignment to the output or input terminals of an electronic device;

FIG. 34 is a perspective view of yet another type of lead frame design in accordance with the present invention utilized in connection with a horizontal stack of chip capacitors, wherein the location of the mounting tab can be adjusted up and down for alignment with input or output terminals or a bus bar;

FIGS. 35a–35c illustrate a novel chip capacitor wherein the four-terminal lead frame is formed by the capacitor termination material itself in conjunction with unique electrode geometry, wherein FIG. 35a is a perspective view thereof, FIG. 35b illustrates the configuration of a first set of electrode plates therein, and FIG. 35c illustrates the configuration of a second set of electrode plates therein;

FIG. 38 is a perspective view similar to FIG. 37 and showing yet another embodiment of a four terminal lead frame, wherein two tabs are bent out for mechanical attachment by screw, rivet, solder or the like;

FIGS. 41a–41c illustrate a capacitor with a unique transmission line style lead frame having fold under tabs for surface mounting similar to that illustrated in FIG. 28, and including the use of an adhesive or nonconductive epoxy between the capacitor, the cover layers and the circuit board or substrate, wherein FIG. 41a is a perspective view thereof, FIG. 41b is a bottom view thereof; and FIG. 41c is a side view;

FIGS. 42a–42c illustrate the novel chip capacitor of FIGS. 35a–35c, wherein a supplemental epoxy dot provides additional mechanical strength for mechanical shock and vibration applications, and wherein FIG. 42a is a perspective view thereof, FIG. 42b is a bottom view thereof, and FIG. 42c is a side view;

FIGS. 43a and 43b illustrate another type of four terminal capacitor lead frame (similar to that shown in FIG. 34) having a number of through-holes added, wherein FIG. 43a is a perspective view thereof, and FIG. 43b is an enlarged fragmented perspective view of the section indicated by the line 43b in FIG. 43a;

FIGS. 45a and 45b illustrate the use of several different types of stress relieving leads for mounting the four terminal capacitor to a circuit board or substrate, wherein FIG. 45a is a perspective view of a capacitor utilizing J-leads, and FIG. 45b illustrates a number of additional possible shapes for the stress relieving leads or tabs.

DETAILED DESCRIPTION OF THE PREFERRED EMBODIMENTS

Figure 7:
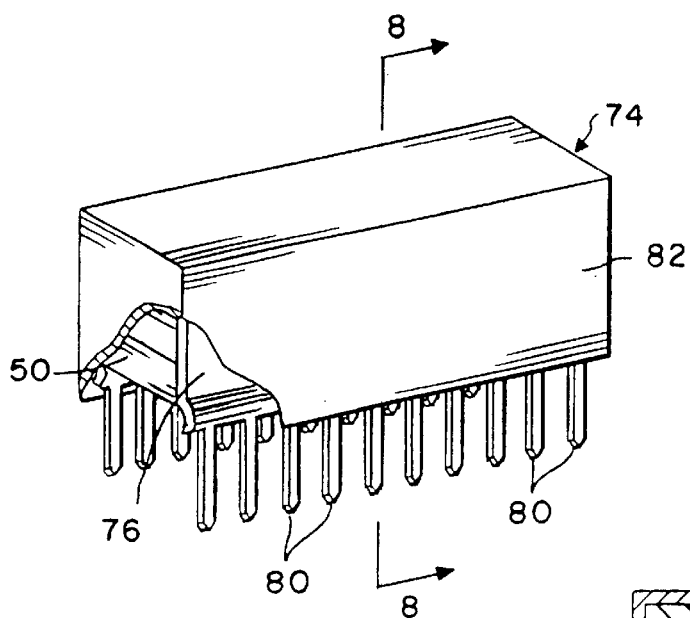
FIG. 7 is a partially fragmented perspective view of a prior art monolithic ceramic capacitor stack wherein a plurality of chip capacitors are stacked horizontally.

As shown in the drawings for purposes of illustration, the present invention is concerned with an improved capacitor lead frame design which acts as a transmission line. The improved lead frame routes the output current or input current of an electronic device through the capacitor in a manner which causes it to act as a four terminal network. This dramatically reduces the inductance and ESR of the device, thereby improving its high frequency and pulse performance. The invention is particularly suited to the type of monolithic ceramic stacked capacitors that are used in surface mount power supplies, buck regulators and DC to DC converters to control output ripple current. As the switching frequency of switch mode power supplies has increased, the output filter capacitor equivalent series inductance (ESL) and equivalence series resistance (ESR) has become increasingly important. The improved capacitor transmission line lead frame as described herein, eliminates the external inductance so that all that is left is a very small internal inductance from the capacitor itself. The novel lead frame routes the circuit current past the capacitor's inductance such that it is no longer in series. This results in a dramatic improvement in the bypassing or attenuation of high frequency ripple. The transmission line lead frame as described herein is also suitable for a wide variety of other applications, including electromagnetic interference filters, high frequency input filters, and other low inductance applications. The transmission line style lead frame is particularly suited to individual or stacked monolithic ceramic capacitors; however, it is also suitable for a wide variety of other capacitor dielectric technologies, including stacked film, tantalum, aluminum electrolytic and the like.

Devices embodying the invention, as illustrated herein, typically include one or more chip capacitors 108, stacked either horizontally or vertically, and a pair of lead frames 110 which are either formed with or conductively adhered to first and second metallization bands 112 and 114 typically provided the chip capacitors along opposite edges thereof, which metallization bands 112 and 114 are, respectively, coupled to the first and second sets of electrode plates 116 and 118 within the capacitors 108. The lead frames 110 are provided with connectors 120 of various configurations to conductively connect the lead frames 110 and the associated capacitor(s) 108 with a pair of circuit traces 122 and 124 provided in a printed, integrated or the like circuit board. In the following description, functionally equivalent elements of the various embodiments will share the same reference number.

Figure 24:
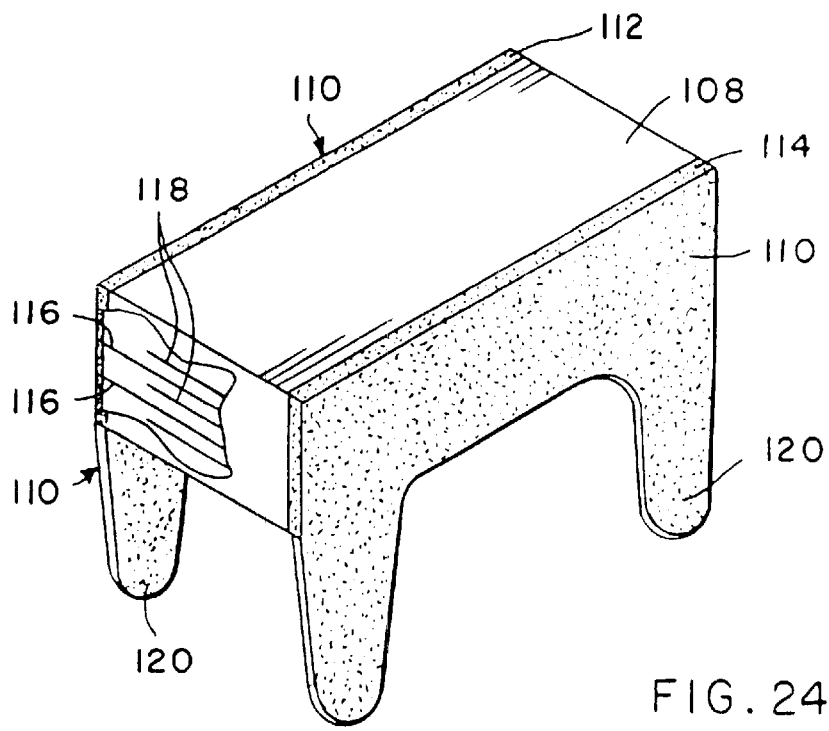
FIG. 24 is a perspective view of a single monolithic ceramic capacitor oriented horizontally and having the novel four terminal transmission lead line frame in accordance with the present invention.

Referring to FIG. 24, there is shown one preferred embodiment of the four terminal transmission line style lead frame in accordance with the present invention. In this case, a single monolithic ceramic capacitor 108 is stacked horizontally between the lead frames 110. This design has extremely low ESL. The particular configuration shown routes the output current of a device such as a switch mode power supply (SMPS) through the unique frame lead itself. This completely eliminates the lead frame inductance and, accordingly, the relatively small capacitor internal inductance is all that remains. The length to width radio of the capacitor illustrated in FIG. 24 is such that the capacitor is terminated along its long sides which further reduces ESR and internal capacitor inductance. The lead frames 110 illustrated are relatively thin and are typically attached to the capacitor 108 by means of soldering, brazing, conductive adhesives or other suitable metallic connection.

Figure 25:
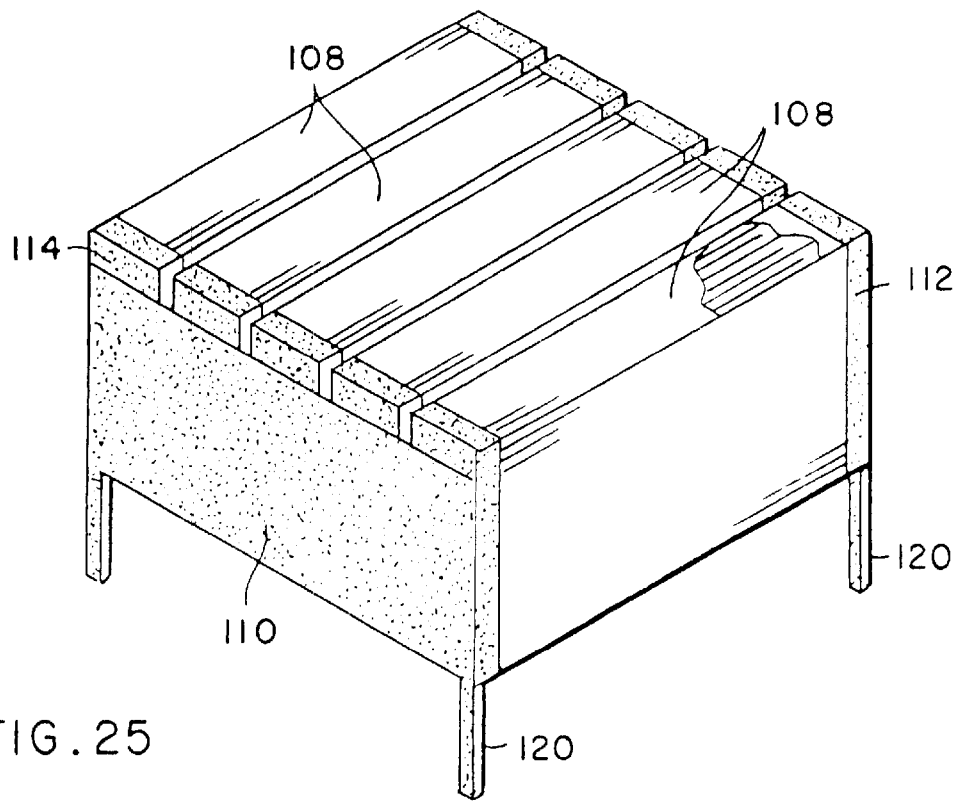
FIG. 25 is a perspective view of a plurality of vertically stacked ceramic capacitors having the novel four terminal transmission lead line frame in accordance with the present invention.

FIG. 25 illustrates a capacitor array of vertically stacked chip capacitors 108 provided with optional air gaps therebetween to reduce thermal and mechanical stress, connected to one another by means of the lead frames 110. The connectors 120 in this case are configured for through-hole board or substrate mounting. The thickness of the lead frame varies with device current rating. Moreover, the length-to-width ratio of the device illustrated in FIG. 25 is average as to ESL.

Figure 22:
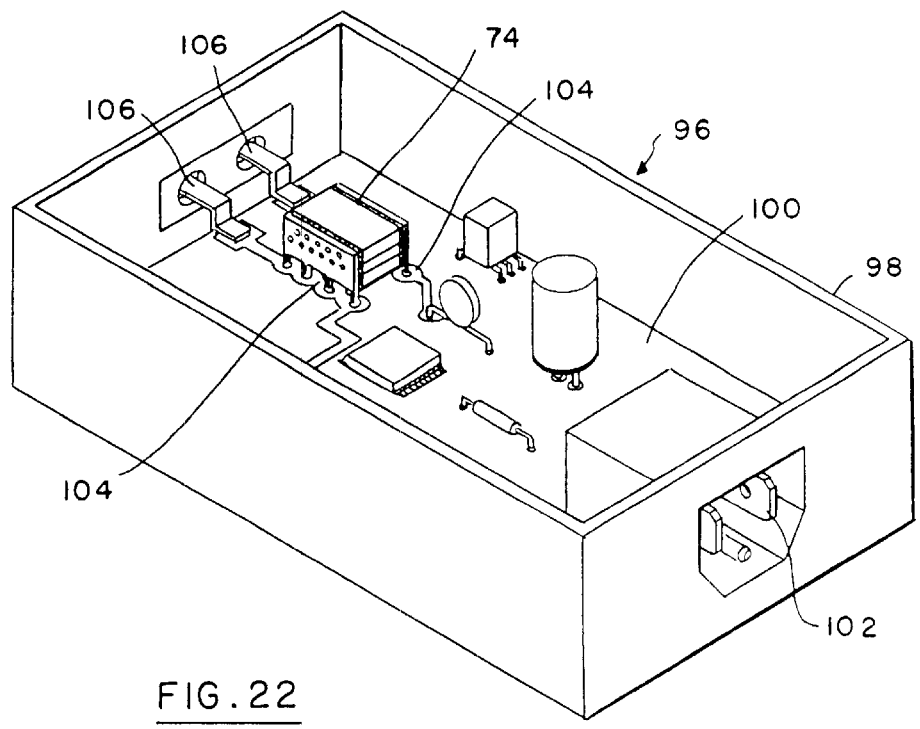
FIG. 22 is a perspective view of an exemplary switch mode power supply (SMPS) having the prior art stacked capacitor array of FIG. 7 therein.
Figure 23:
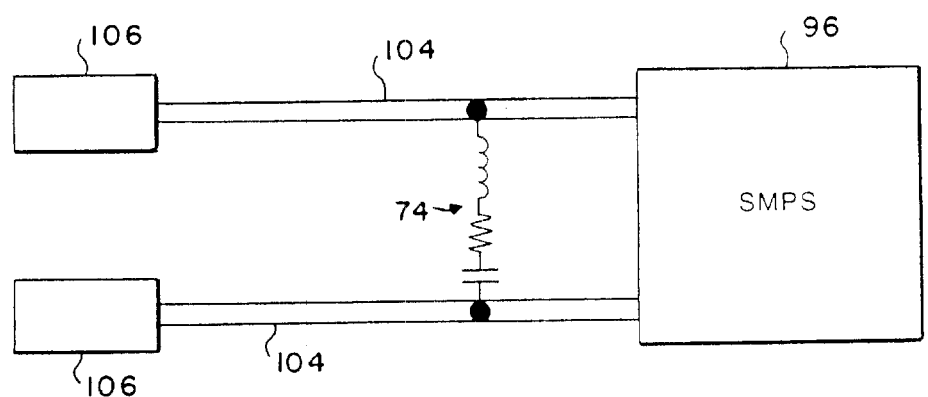
FIG. 23 is a schematic representation illustrating electrical characteristics of the prior art stacked capacitor within the switch mode power supply of FIG. 22.
Figure 26:
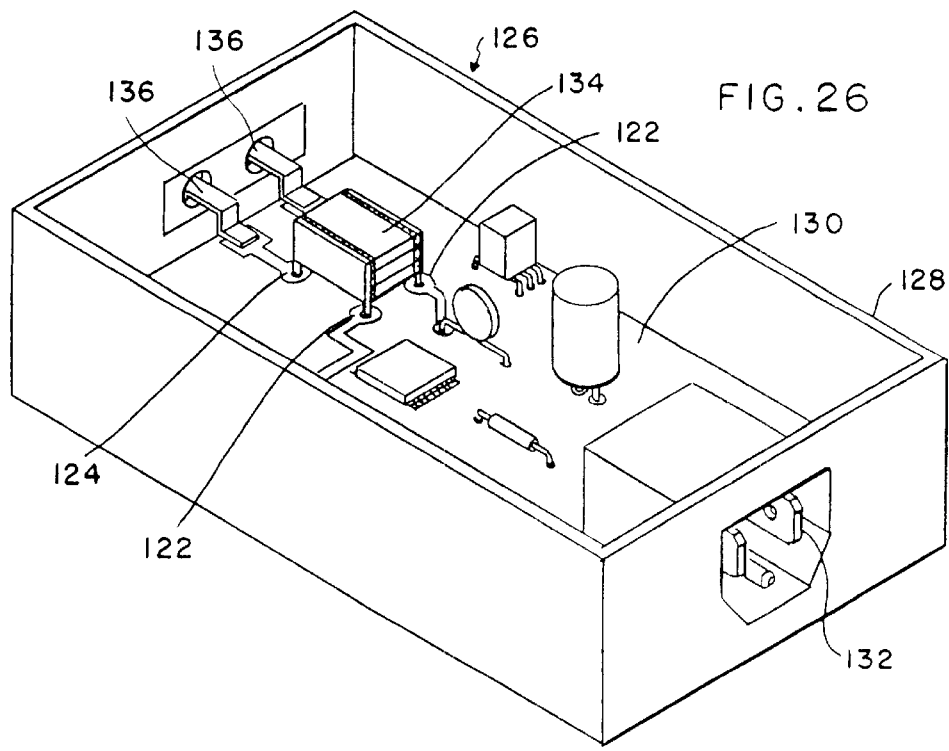
FIG. 26 is a perspective view of a switch mode power supply similar (SMPS) to that illustrated in FIG. 22, wherein a capacitor array having a plurality of horizontally stacked chip capacitors is provided with the novel lead frame of the present invention (similar to that illustrated in FIG. 30), and is connected to circuit traces within the SMPS so that output current is routed in and out of the lead frame so as to provide a four terminal transmission line lead design which minimizes or eliminates frame lead inductance.
Figure 27:
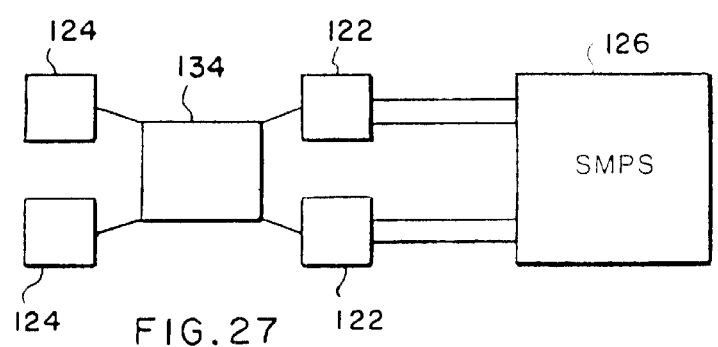
FIG. 27 is a schematic representation of the effect of utilizing capacitors provided with the novel four terminal transmission lead line frame in the circuit, in comparison with the standard prior art design illustrated in FIG. 23.

FIG. 26 illustrates a typical switch mode power supply 126. In particular, there is shown a housing 128 having an open top to illustrate typical interior circuit topology. Within the housing 128 there is provided a circuit board 130. An AC plug 132 extends through an end of the housing 128 to provide a power supply means for the circuit board 130 and its components. A capacitor array 134 embodying the invention (similar to that illustrated in FIG. 30) is conductively coupled to the circuit board at input trace lands 122 and output trace lands 124. The output trace lands are conductively coupled to output terminals 136 for the switch mode power supply 126. Thus, the configuration of the switch mode power supply 126 is quite similar to the switch mode power supply 96 illustrated in FIG. 22. However, the schematic representation of the effect of the capacitor array 134 is shown in FIG. 27 when compared with a prior art capacitor array 74 as illustrated in FIG. 23. In particular, use of the capacitor array 134 which incorporates the novel lead frames 110 of the present invention results in the capacitor array functioning as a four terminal output capacitor. As can be seen, the output current of the switch mode power supply 126 is routed into and through the capacitor and out the other side. In actual practice, the novel capacitor would be mounted much closer to the circuit board or substrate. It is shown stood off in height above the board at a considerable distance for reason of understanding the principle of routing the current output in and through the lead frame and back out.

Figure 28:
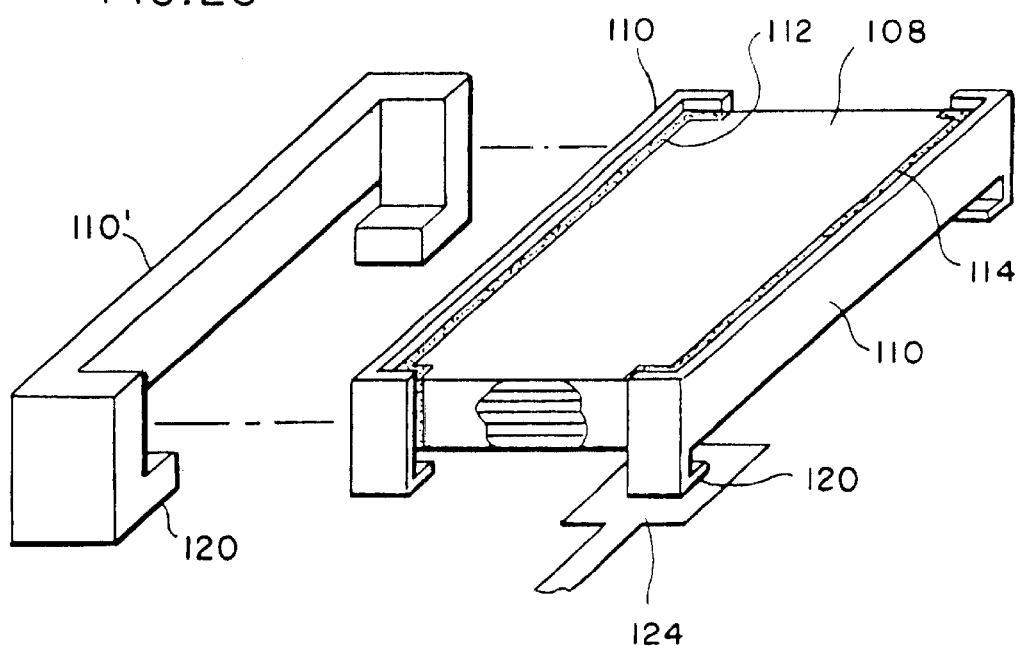
FIG. 28 is a perspective view of the novel capacitor of FIG. 24 with a unique transmission line style lead frame with fold under tabs for surface mounting instead of through-hole mounting.

FIG. 28 shows a single chip capacitor 108 with unique transmission in-line style lead frames 110 having fold under tabs 120 for surface mounting instead of through-hole mounting. The tab can be flush with the capacitor or spaced as shown to space the capacitor away from the mounting substrate or circuit board. Exploded out to one side is an alternative lead frame 110' wherein the thickness has been increased for heavy duty four-terminal lead frame applications (high current applications).

Figure 29:
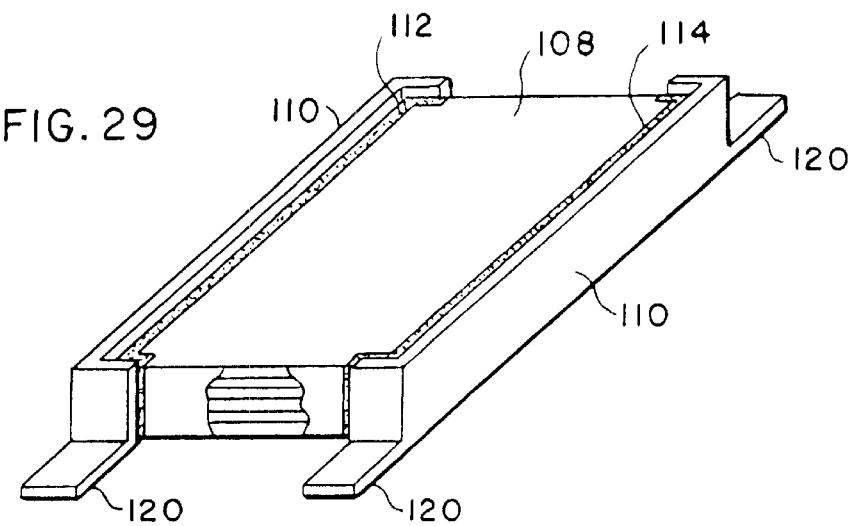
FIG. 29 illustrates the capacitors of FIGS. 24 and 28 with a flush tab which is flared out also for a circuit board or substrate mounting onto circuit trace lands.

FIG. 29 illustrates use of another style of lead frame 110 in connection with the chip capacitor 108. In this case, the connectors 120 comprise flush tabs which are flared out also for a circuit board or substrate mounting onto lands.

Figure 30:
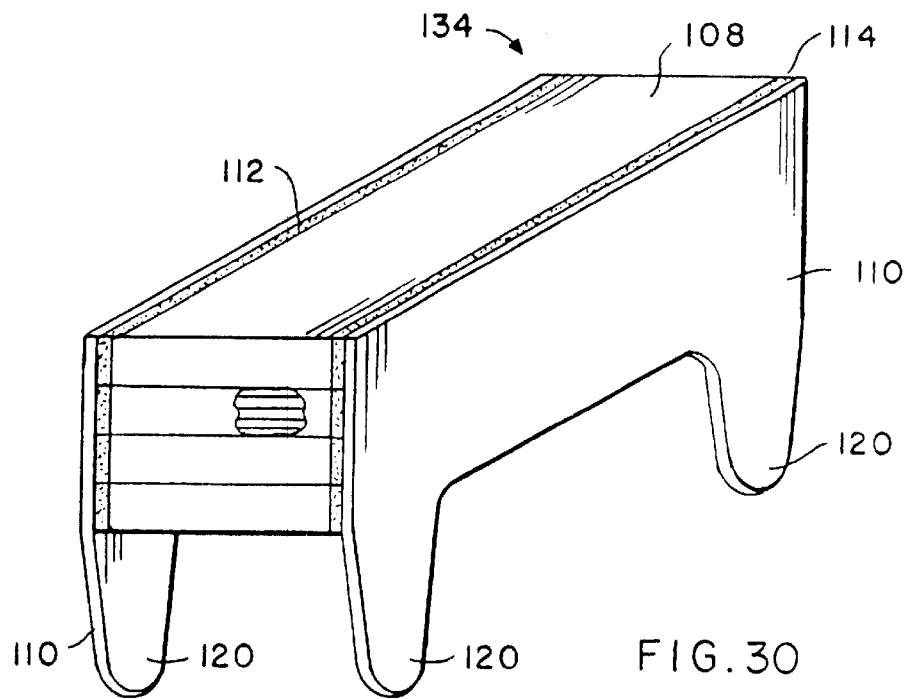
FIG. 30 illustrates an exemplary capacitor array having a plurality of horizontally stacked chip capacitors with the four terminal transmission line lead frame conductively attached along the long edges of the capacitors to provide a "good" form factor.

FIG. 30 illustrates a plurality of horizontally stacked chip capacitors 108 having exterior metallization 112 and 114 along their long edges, and wherein lead frames 110 are conductively coupled to the exterior metallization in a manner similar to that illustrated in FIG. 24. The particular capacitor array 134 illustrated has a "good" form factor. This capacitor is long and narrow with the four-terminal transmission line style lead frame along the long edge. This makes the cross-section of the electrode plates small which reduces the internal inductance and equivalent series resistance of the capacitor.

Figure 31:
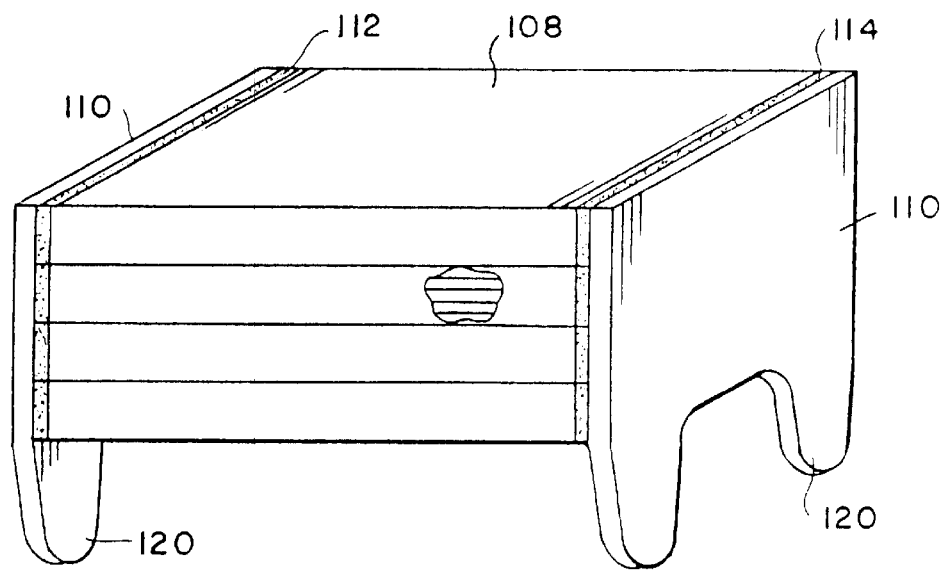
FIG. 31 is a partially fragmented perspective view similar to FIG. 30, illustrating a "poor" form factor wherein the novel transmission line lead frame of the present invention is connection to the capacitors along their short sides.

FIG. 31 is a capacitor array similar to that illustrated in FIG. 30, but with a "poor" form factor. This particular capacitor array is also long and narrow, however the transmission line style lead frame 110 is connected along its short side. This results in relatively long or lengthy internal electrodes, which tends to increase the internal inductance of the capacitor and also its equivalent series resistance.

FIG. 32 illustrates yet another type of lead frame 110 construction. Here, the lead frames are provided with pegs which form the connectors 120 for insertion into a typical circuit board through-hole and mounting pad 122. The insertion lead cross-section can be fabricated in many shapes, for example round, square, rectangular, oval, triangular, etc.

FIG. 33 illustrates another chip capacitor 108 having a pair of oppositely disposed lead frames 110 of another unique type of configuration. In this case, the mounting tabs 120 can be modified so that their height can be adjusted for convenient alignment to the output terminals of an electronic device (or input terminals). The width of said terminals is controlled by controlling the width of the tab as it goes around the corner of the capacitor.

FIG. 34 is a perspective view of a capacitor array provided with unique lead frames 110 which are similar to those shown in FIG. 33. The location of the mounting tabs 120 can be moved up and down to align with convenient input or output terminals or bus bars. The mounting tabs 120 are illustrated with through holes for attachment to bus bars by machine screws or other fasteners. These tabs 120 can be adapted for soldering, wire-bonding, brazing, welding or other connection means. The particular four-terminal lead frame 110 illustrated in FIG. 34 is designed for high current applications. The lead frame can be manufactured from a highly conductive material such as copper, brass or silver. Conductive platings or finishes also enhance the current carrying capabilities and inhibit corrosion. Preferred platings include electro-tin, silver, solder, gold, nickel and the like.

Figure 35A:
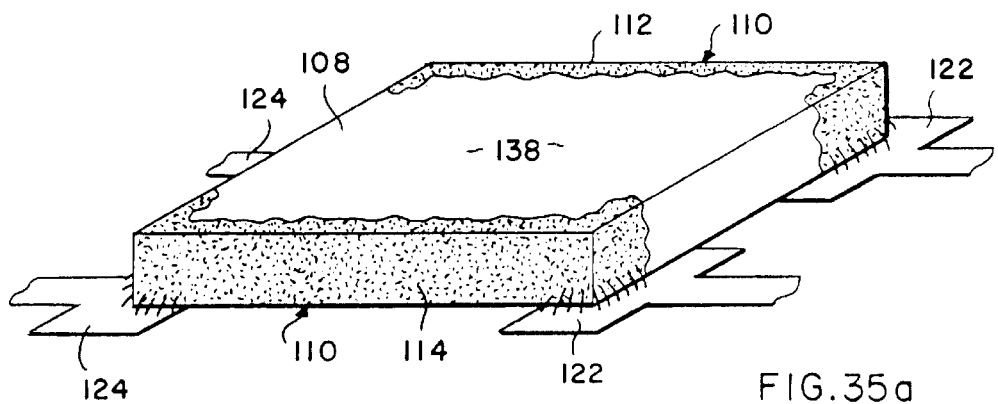
Figure 35B:
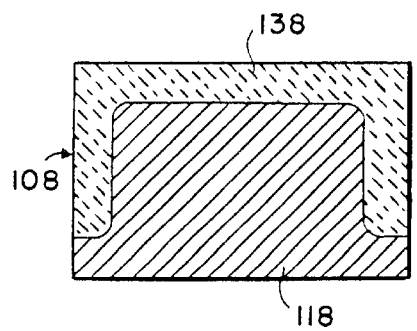
Figure 35C:
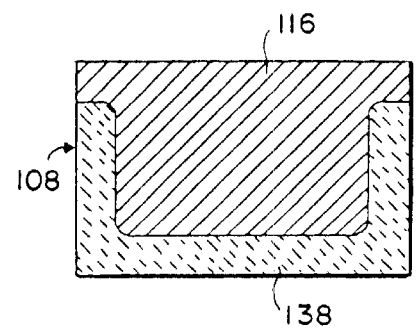

FIGS. 35a–35c illustrate a novel chip capacitor 108 wherein the novel four-terminal lead frame is formed by the capacitor termination material or metallization band 112 and 114 in conjunction with a unique electrode plate 116 and 118 geometry. As illustrated in FIG. 35a, the first metallization band 112, which is conductively coupled to the first set of electrode plates 116, is of sufficient thickness to function as the lead frame 110 and provides the attenant advantages as described above. Similarly, the second metallization band 114, which is conductively coupled to the second set of electrode plates 118, is also of sufficient thickness to function as a lead frame 110 with all of the attenant advantages discussed above. The capacitor 108 is, otherwise, of standard construction, and FIGS. 35b and 35c illustrate the lay-up pattern of the first and second sets of electrode plates 116 and 118 within a ceramic dielectric material 138. This novel capacitor electrode shape also is very efficient when used in conjunction with any of the other four terminal capacitor lead frames illustrated herein and described above.

Figure 36:
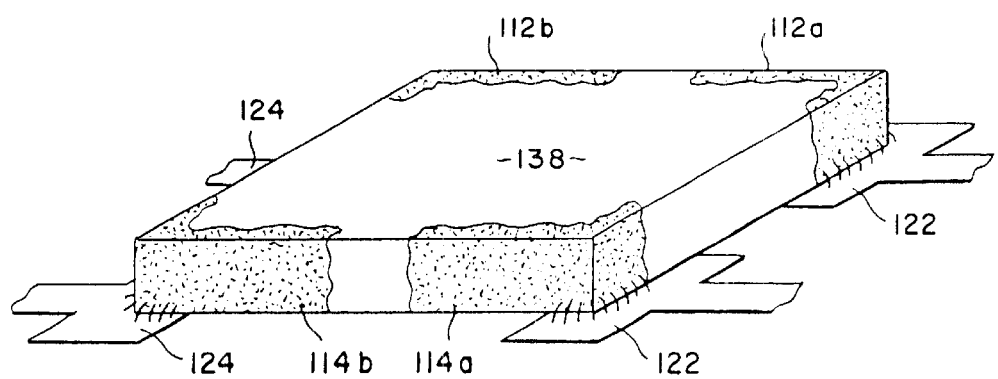
FIG. 36 illustrates a chip capacitor similar to that shown in FIG. 35a, wherein the capacitor termination material is configured to have a non-conductive gap on each side of the capacitor to cause the electrode plates to serve as part of the four-terminal lead frame.

FIG. 36 illustrates a chip capacitor 108 similar to that shown in FIG. 35a, wherein the novel four-terminal lead frame is formed, only in part, by the capacitor termination material or metallization bands 112 and 114 in connection with the same electrode plate 116 and 118 geometry as illustrated in FIGS. 35b and 35c. The first metallization band includes two segments 112a and 112b which are spaced to form a non-conductive gap on one side of the capacitor. Similarly, the metallization band 114 includes two segments 114a and 114b which are spaced to also form a non-conductive gap on the other side of the capacitor. These gaps cause the electrode plates 116 and 118 to serve as part of the four-terminal lead frame. The illustrated configuration forces more "circuit through current" into the internal electrodes, thus further reducing ESR/ESL. It will be understood, however, that use of such a capacitor 108 is limited to specific low circuit current applications.

Figure 37:
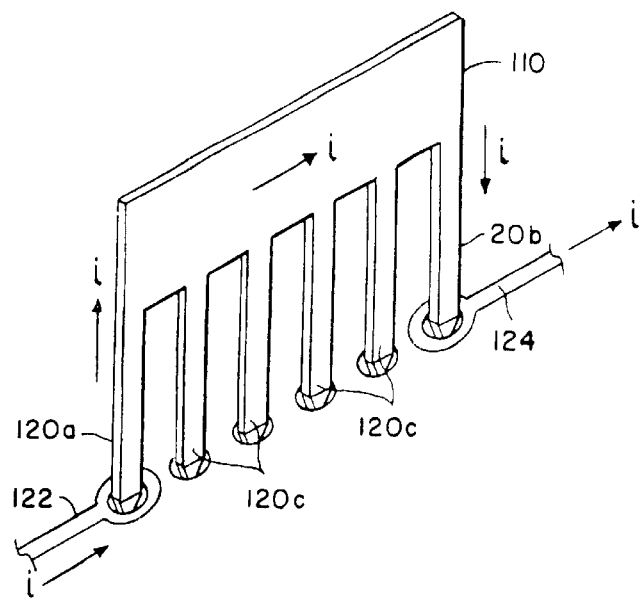
FIG. 37 illustrates another type of four terminal capacitor lead frame within the scope of the present invention, wherein the circuit current enters at one of the outer most pins, flows through the lead frame, and exits at a lead bus terminal (the other four terminals are soldered into plated through-holes on a substrate or circuit board, but make no electrical connection to any point for any circuit)

A disadvantage of the four terminal capacitor lead frames 110 described above is the fact that a fewer number of the leads 120a are holding the capacitor or capacitor array 108 to the circuit board or substrate 130. This can be important when a relatively heavy capacitor is used in high vibration or certain high mechanical shock applications. To address this potential problem, FIG. 37 illustrates a four terminal capacitor lead frame 110 wherein a first connector 120a is conductively coupled to a first circuit trace 122 and a second connector 120b is conductively coupled to a second circuit trace 124 such that circuit current enters at the first connector and flows through the lead frame 110 itself and exits at the second circuit trace 124 as illustrated by the arrows. The other four connectors 120c are soldered into through-holes on the substrate or circuit board, but make no electrical connection to any point or any circuit. These extra lead wires 120c are to provide heat sinking or extra strength for mechanical shock and vibration applications only. In this way, a conventional leaded capacitor can be converted into the four terminal capacitor of the present invention.

Figure 38:
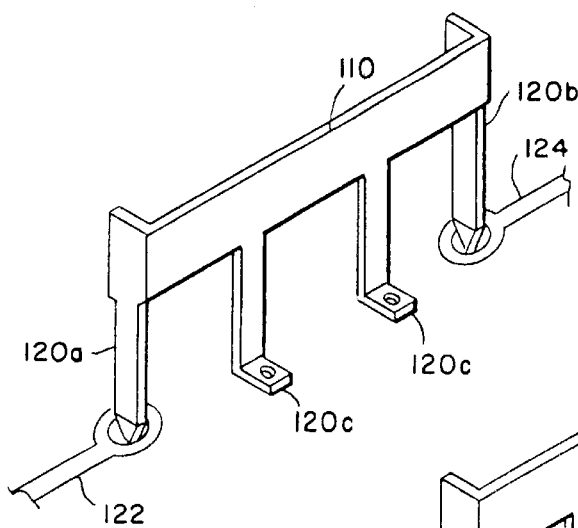

FIG. 38 shows an alternate embodgiment four terminal lead frame 110 wherein the intermediate connectors 120c each include tabs that are bent out for mechanical attachment by screw, rivet, solder or the like to, again, provide additional strength and rigidity for high vibration or mechanical shock applications. Also, as was the case with the four terminal lead frame of FIG. 37, it is very important that these additional leads 120c not make any electrical connection to any circuit or trace within the substrate or circuit board. Any additional connection here would preclude the capacitors proper operation as a four terminal device.

Figure 39:
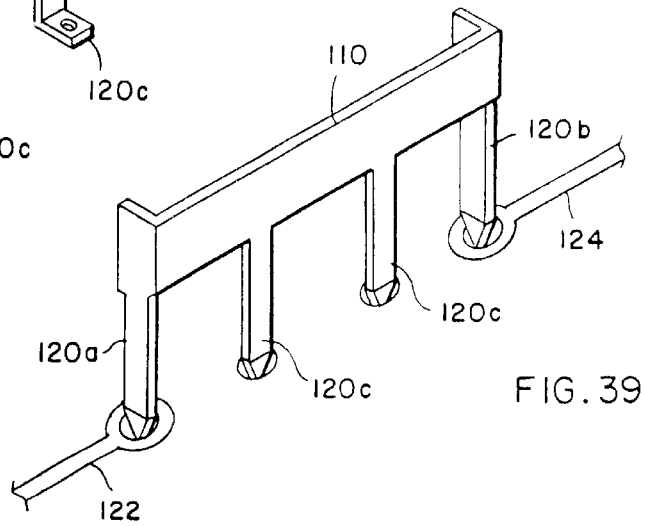
FIG. 39 is a perspective view similar to FIG. 38, illustrating another embodiment of a four terminal lead frame.

FIG. 39 shows yet another embodiment of a four terminal lead frame 110 similar to those illustrated in FIG. 32. As was the case in FIGS. 37 and 38, one or more lead pins 120c can be added for through-hole mounting where no electrical connection is made. The extra pins are simply for mechanical shock or high vibration applications, or heat sinking applications.

Figure 40:
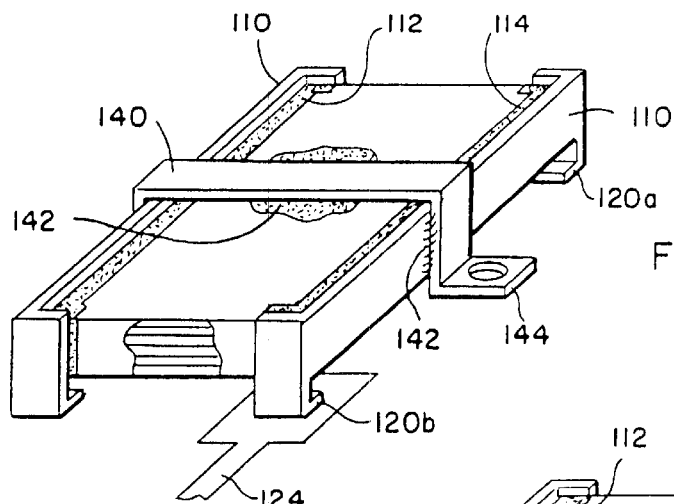
FIG. 40 is a perspective view similar to FIG. 28, illustrating the addition of a strap for the purpose of providing extra strength for mechanical shock or vibration applications.

FIG. 40 illustrates the single chip capacitor 108 with the unique transmission in-line style lead frames 110 having fold under tabs for surface mounting instead of through-hole mounting as illustrated in FIG. 28. FIG. 40 illustrates the addition of a mechanical strap 140 for the purpose of providing extra strength for mechanical shock or vibration applications. The strap 140 may be manufactured as part of the lead frame 110 or added later as shown. The strap 140 is bonded to both the upper most capacitor 108 and to the lead frames 110 by an adhesive 142, epoxy, solder, welding, brazing or the like. As shown, the strap 140 includes a tab 144 to facilitate mechanical (nonelectrical) connection to the underlying substrate or circuit board.

As an alternative to using supplemental leads 120c or bonding straps 140 for high mechanical shock and vibration applications, another technique is to place one or more bonds of an adhesive or nonconductive epoxy between the capacitor 108 and the underlying circuit board or substrate 130. The adhesive material must be chosen very carefully so that it is compatible with the ceramic capacitor 108. For example, very hard, unfilled epoxies can induce fractures within the ceramic capacitor due to their mismatch in their thermal coefficients of expansion. It is preferred that semi-rigid or soft epoxies are used for this application since they will not impose severe mechanical stress on the capacitor dielectric. This is particularly important for ceramic capacitors where the dielectric choice is often barium titanate. Barium titanate is notoriously weak in tension. Common epoxy fillers can be alumina or talc, which cause a reduction in the Shore-D hardness of the epoxy. Filled or soft adhesives are much more compatible with the ceramic dielectric in that they do not induce fractures in the capacitor body itself. Using a supplemental adhesive or epoxy bond to add additional mechanical strength can be done in conjunction with any of the four terminal capacitor lead frames.

Figure 41A:
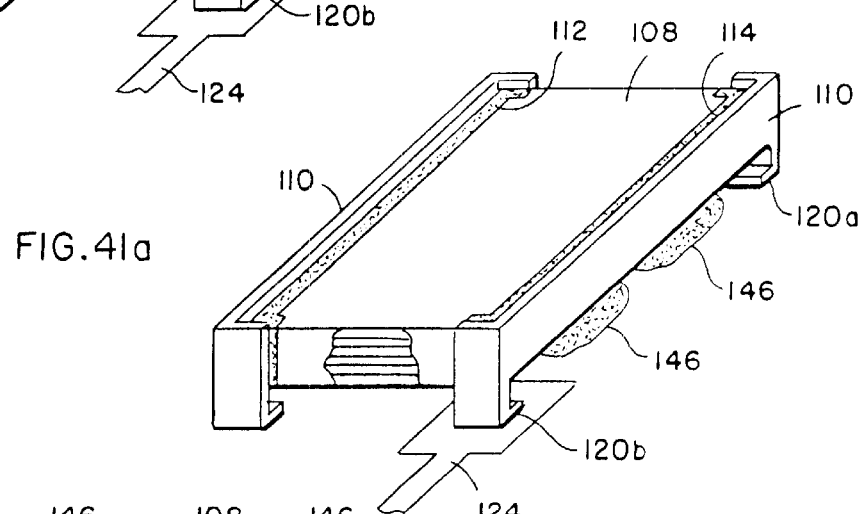
Figure 41B:
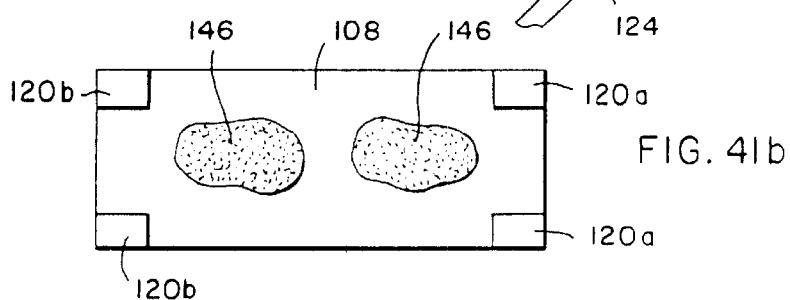
Figure 41C:
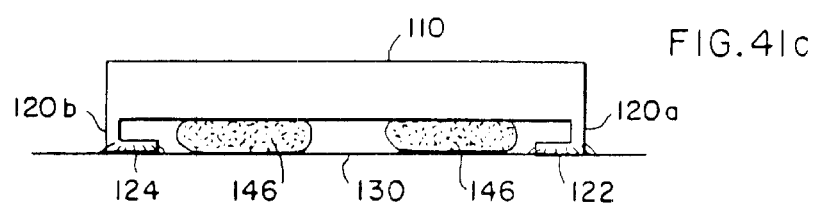

Accordingly, FIGS. 41a–41c illustrate the single chip capacitor 108 with unique transmission lead frames 110 having fold under tabs 120a and 120b for surface mounting instead of through-hole mounting, as shown in FIGS. 28 and 40. The primary difference here is that instead of the strap 140 shown in FIG. 40, supplemental epoxy 146 is provided between the undersurface of the capacitor 108 and the underlying circuit board 130.

Figure 42A:
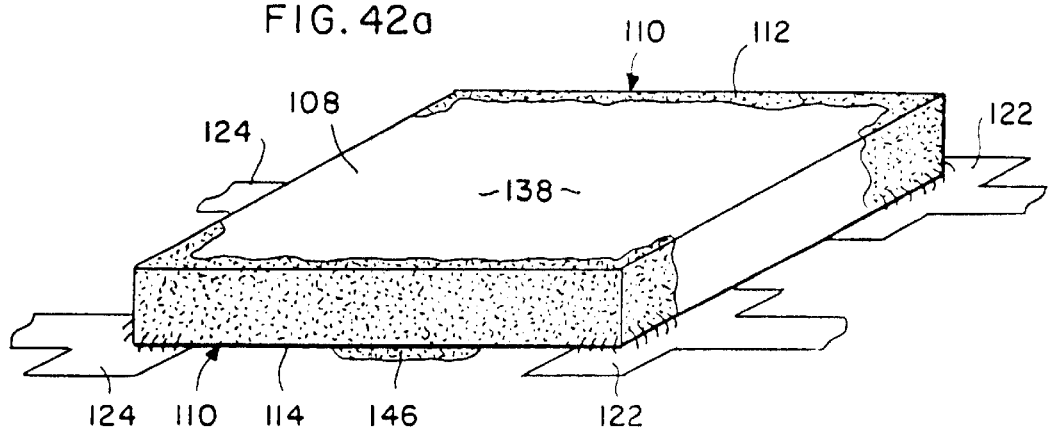
Figure 42B:
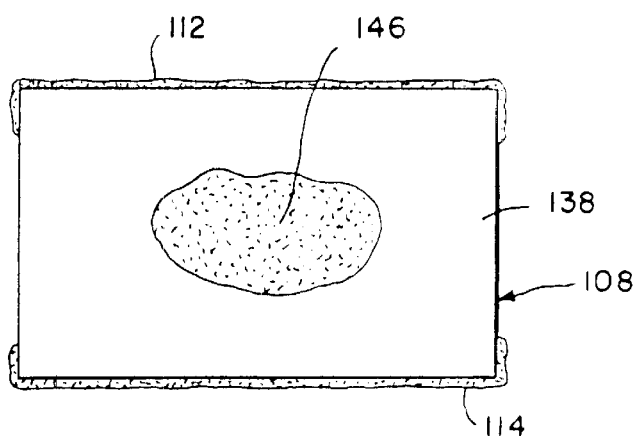
Figure 42C:
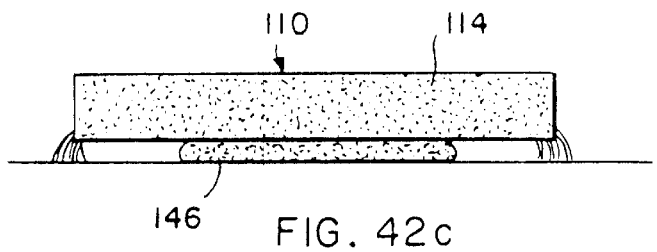

FIGS. 42a–42c illustrate the novel chip capacitor 108 wherein the four terminal lead frame is formed by the capacitor termination material or metallization bands 112 and 114 as illustrated in FIGS. 35a–35c. In this case, however, a supplemental epoxy dot 146 provides additional mechanical strength for mechanical shock and vibration applications. In such an application where an adhesive or epoxy bond is used to add additional mechanical strength, it is preferred that a nonconductive epoxy or adhesive material be utilized which has a very high rate of thermal conductivity. The four terminal capacitors that are used in the output or input of surface mount power supplies can get very hot due to the power dissipation within the capacitor's equivalent series resistance. Having a thermally conductive heat sink in these cases can prevent the capacitor from overheating.

In addition to using filled epoxies or adhesives, there are also a number of off-the-shelf adhesives which are formulated in such a way that they do not become hard upon setting. This includes silicone adhesives, solastics, and the like.

It is important in any application that the user conducts vibration and mechanical shock tests and then carefully examines the ceramic capacitor afterwards to make sure that no micro-fractures or cracks have been induced. Micro-fractures or cracks are not always immediately obvious, in that they may show up as latent electrical defects. The latent failure modes include a reduction in capacitor lifetime, increased susceptibility to moisture and solvents, and a reduction in insulation resistance at either 25° C. or 125° C.

Figure 43A:
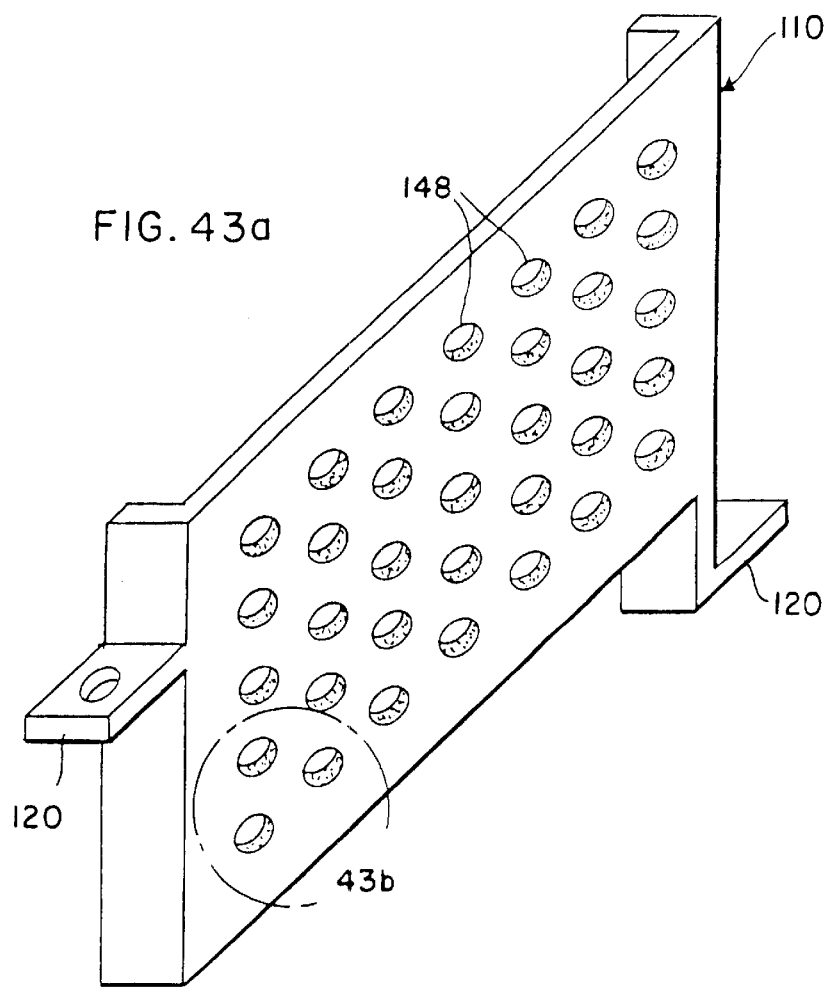
Figure 43B:
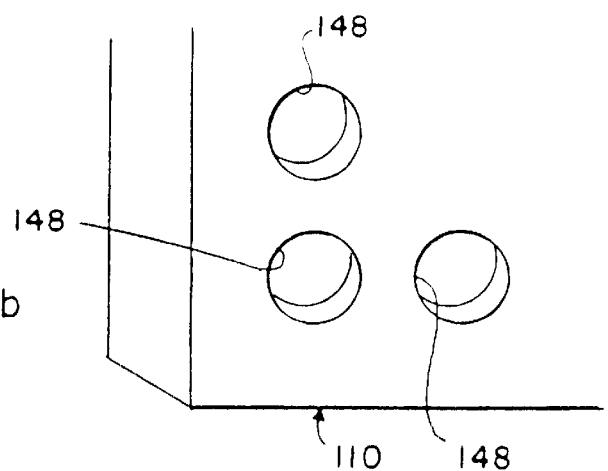

FIGS. 43a and 43b show a four terminal capacitor lead frame similar to that illustrated in FIG. 34 with the addition of a number of through-holes 148. These through-holes 148 go through the lead frame 110 in order to provide additional bonding strength between the lead frame 110 and the capacitor termination material 112, 114. These through-holes 148 increase the attachment strength of the lead frame by providing an area where the conductive materials, such as solder or a conductive adhesive or a conductive epoxy, can penetrate either wholly or partially into these holes and pick up shear strength due to the wall or cylinder of the hole itself. This increase in surface area greatly increases the mechanical attachment strength, and also reduces the ESR by increasing the surface area of the contact. It should be understood that the through holes 148 may be applied to any number of the lead frames 110 discussed above, and further that the through holes 148 do not need to be round, but may be triangular, rectangular, square or the like.

Figure 8:
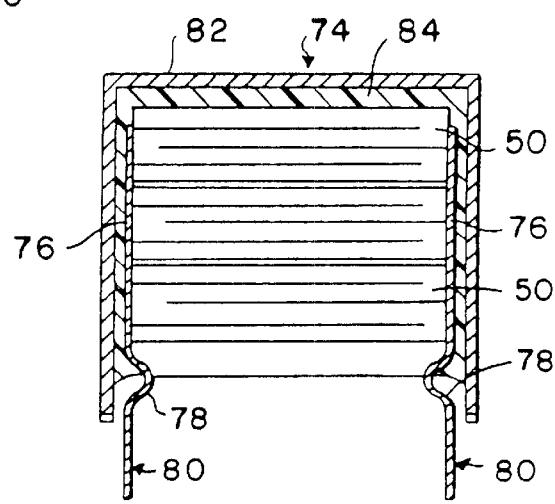
FIG. 8 is an enlarged sectional view taken generally along the line 8—8 of FIG. 7.
Figure 9:
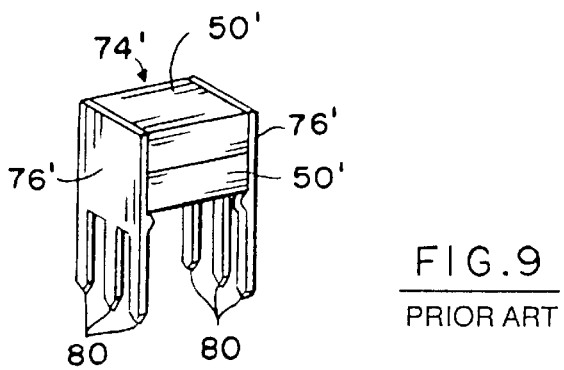
FIG. 9 is a perspective view of another prior art MLC stacked capacitor for switch mode power supply applications.
Figure 10:
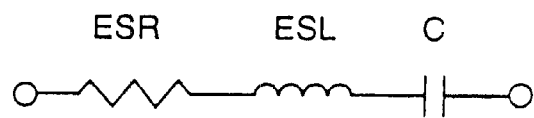
FIG. 10 is a simplified equivalent circuit model of a conventional (non-feedthrough) capacitor at all frequencies.
Figure 11:
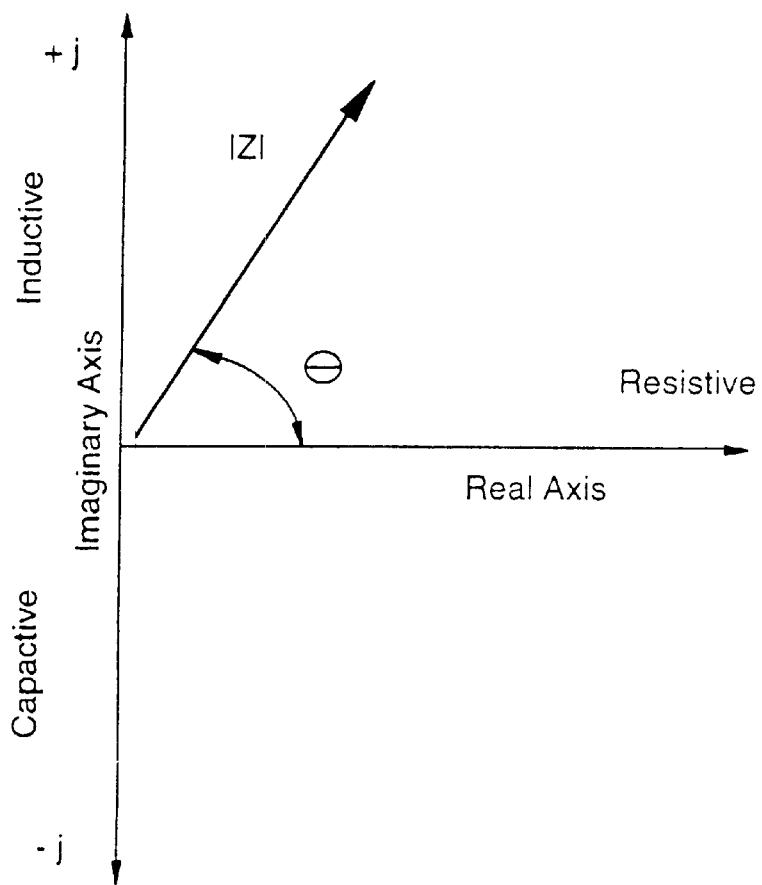
FIG. 11 is a graph showing capacitor phase-vector relationships.
Figure 12:
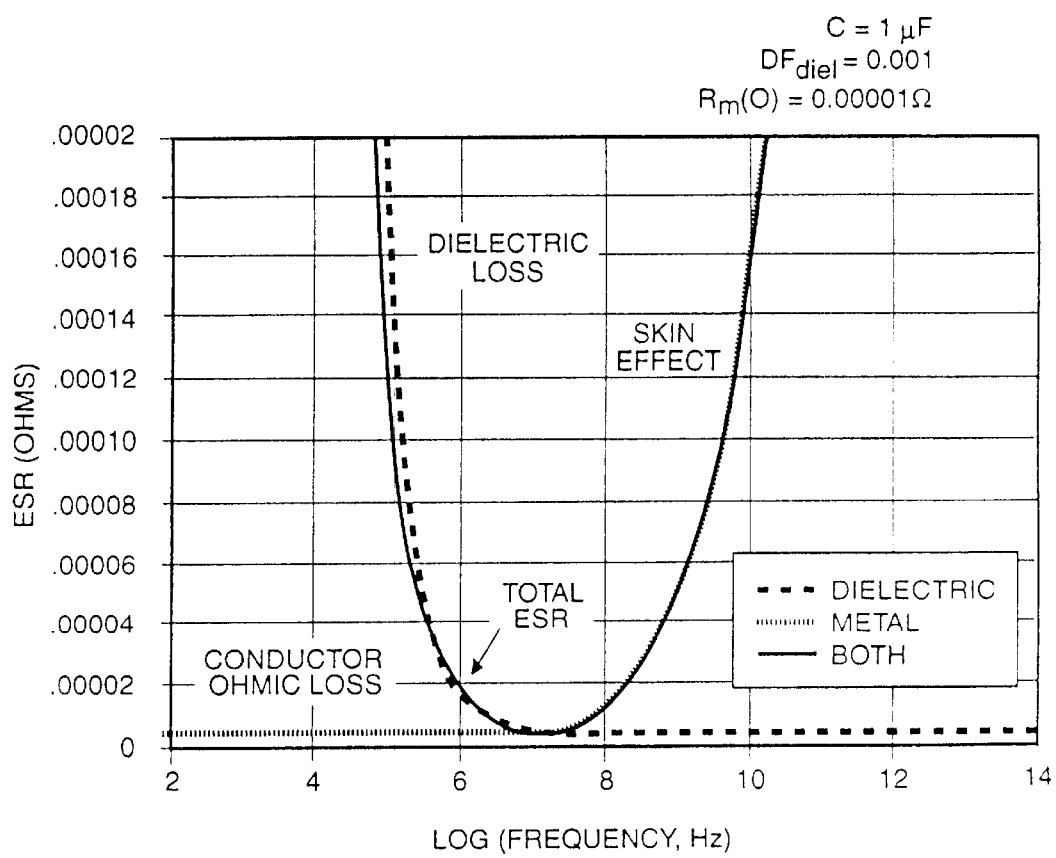
FIG. 12 is a graph showing equivalent series resistance (ESR) versus frequency for a generic capacitor.
Figure 16A:
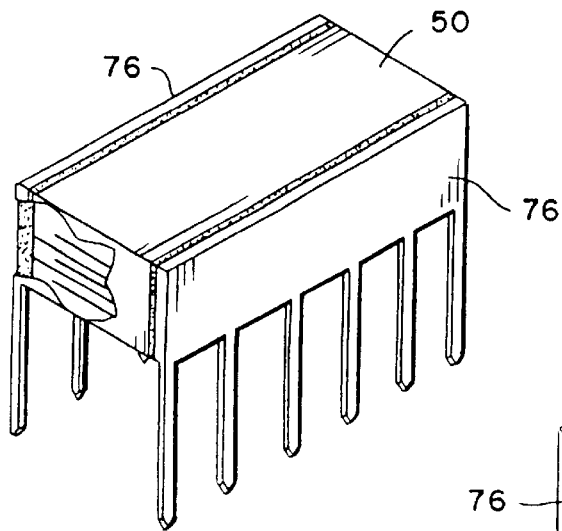
FIG. 16a is a perspective view of a prior art multi-layer ceramic capacitor (MLC) chip that is terminated along its opposite long sides with a narrow cross-section to provide a desirable form factor which results in lower ESL and lower ESR.
Figure 16B:
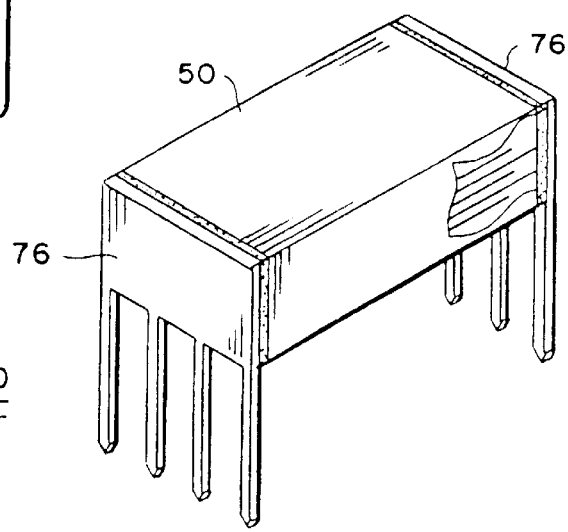
FIG. 16b is a perspective view of a multi-layer ceramic capacitor (MLC) chip similar to that illustrated in FIG. 16a, which is terminated on its short ends which results in a poor form factor and in relatively high ESL and ESR.
Figure 17:
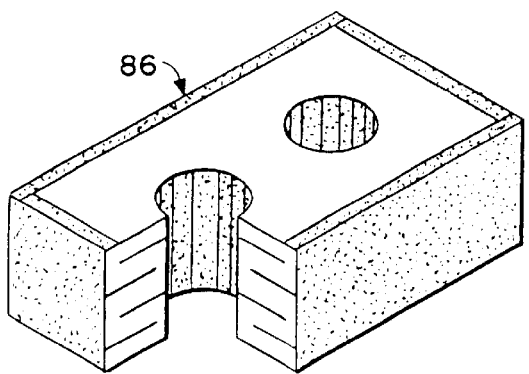
FIG. 17 is a partially sectional perspective view of a prior art dual terminal feedthrough capacitor.
Figure 18:
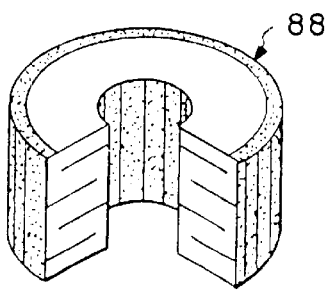
FIG. 18 is a partially sectional perspective view of a single terminal prior art feedthrough capacitor.
Figure 21A:
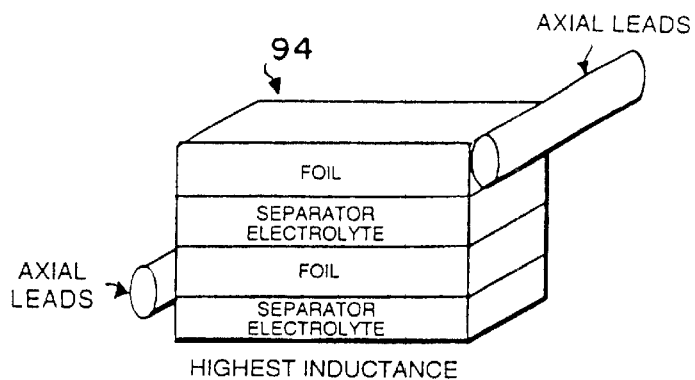
FIGS. 21a–21d are schematic illustrations showing how proper tab construction can reduce ESL in AL or aluminum-electrolytic capacitors.
Figure 21B:
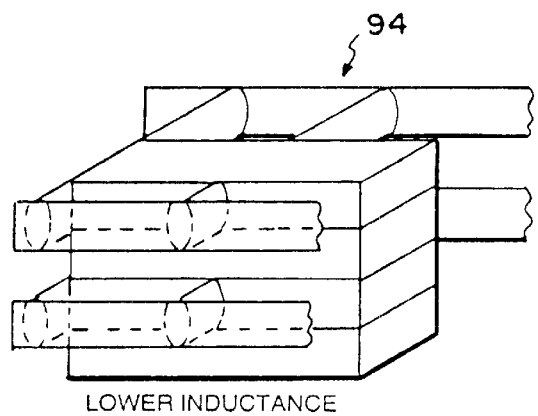
Figure 21C:
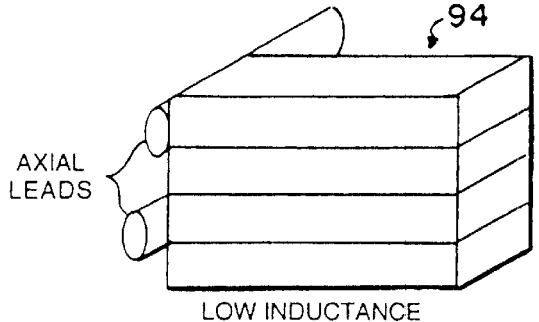
Figure 21D:
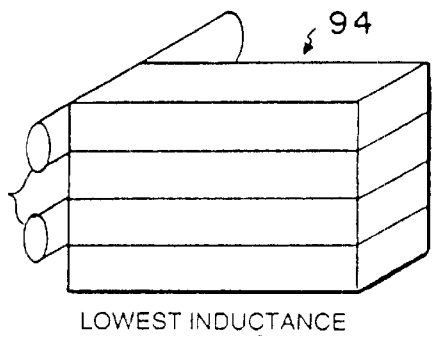
Figure 44:
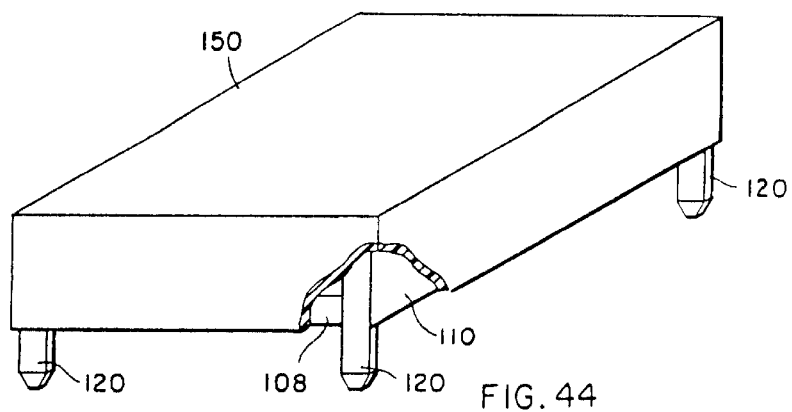
FIG. 44 is a perspective view of an exemplary four terminal capacitor lead frame embodying the present invention, inserted into a non-conductive casing to give the completed capacitor a more finished appearance.

FIG. 44 shows that any of the four terminal capacitor lead frames and associated capacitors shown herein can be inserted into a plastic, epoxy or other cover 150 such that the completed capacitor has a more finished appearance. After the capacitor is inserted into this plastic or epoxy cover 150, it would then be back-filled with a suitable epoxy or adhesive to encapsulate it into the structure. This is similar to the prior art technology illustrated in FIGS. 7 and 8.

Another method (not illustrated) is to cover the completed capacitor with a conformal coating to provide some protection from mechanical damage and also to provide some electrical insulation. The conformal coating also adds an additional barrier to increase the capacitor's moisture resistance. These conformal coatings can be made of many materials that are commonly available in the market place. They may be thermally cured, dried or UV cured.

An advantage of using a cover 150 or conformal coating on the capacitor 108 is it then makes the capacitor easier to mark with its part number, voltage ratings, lot number, date code and so forth.

Figure 45A:
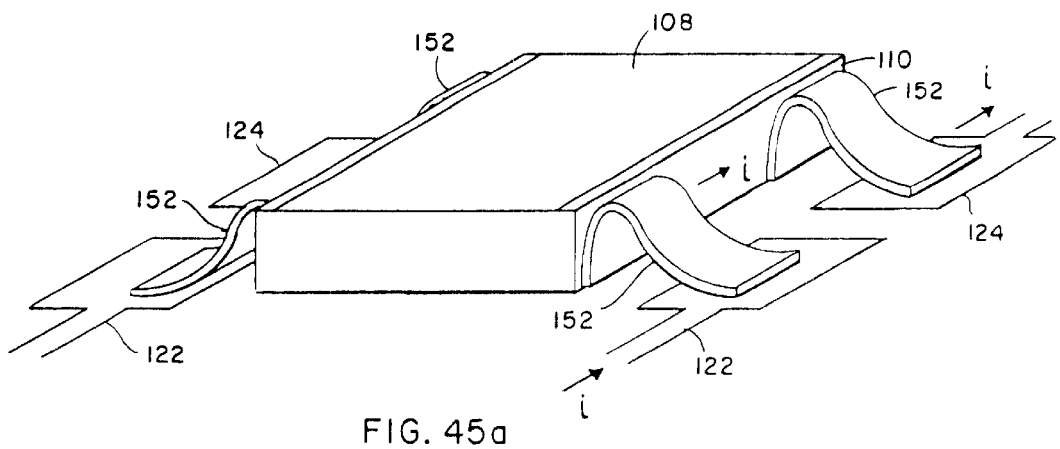

FIG. 45a illustrates the use of J-leads 152 or stress relieving leads to mount the four terminal capacitor to a circuit board or substrate. The J-leads 152 serve the same function as the connectors 120 described above. In this regard, and as previously mentioned, capacitors can be very fragile. This is particularly true for ceramic capacitors where the dielectric is barium titanate. The use of a stress relieving lead prevents the capacitor from cracking when the circuit board or substrate is flexed or subjected to mechanical stresses such as mechanical shock or vibration. The bending of the lead 150 or lead relief prevents the stresses from reaching the ceramic capacitor and cracking it.

The use of J-leads 152 is common in two terminal capacitors. Unfortunately, the use of these leads tends to increase the capacitor's equivalent series inductance. However, this not true in the case of the four terminal device. In this case, additional lead inductance usually helps the capacitor's high frequency or pulse performance in that the novel four terminal approach puts these inductances in series with the circuit output. In this way the capacitor acts as a multi-element filter, which is best modeled as a transmission line.

Figure 45B:
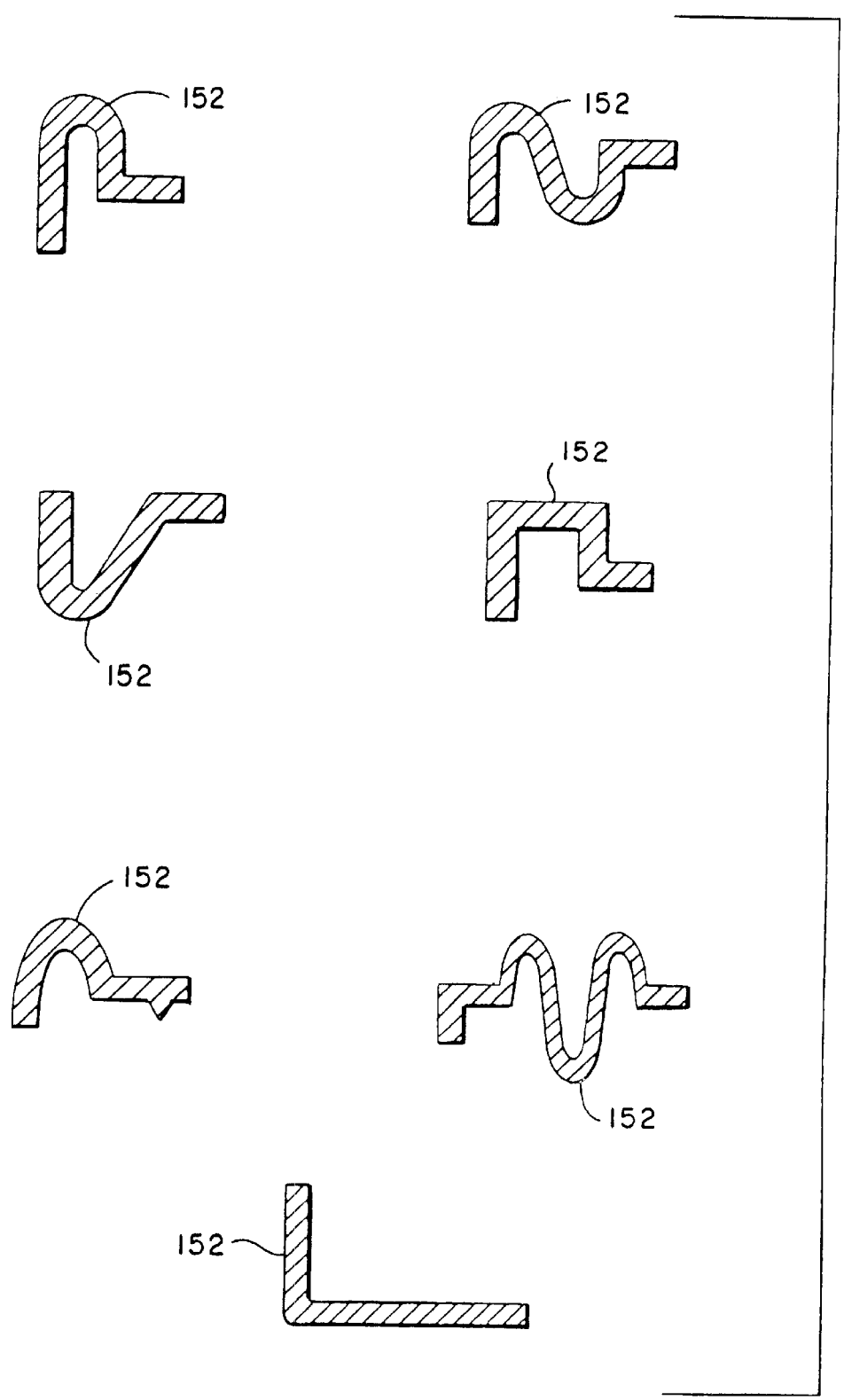

FIG. 45b illustrates a number of other examples of stress relieving shapes that may be formed into leads 152 or tabs. Any of these may be used in conjunction with the four terminal lead frames 110 described herein. It should be apparent that a variety of other sizes and shapes for stress relieving are possible.

Thus, in view of all of the foregoing, it should be apparent that the present invention resides in a chip capacitor which is conductively coupled to spaced-apart (i.e., non-conductively coupled) circuit traces 122 and 124 of an integrated circuit or circuit board 130 to provide a four terminal network. The capacitor 108 comprises a casing of dielectric material 52 having first and second sets of electrode plates 116 and 118 disposed therein, and first and second metallization bands 112 and 114 disposed along respective sides of the casing and conductively coupled to respective sets of the electrode plates 116 and 118. Most of the particular embodiments described above include separate first and second conductive lead frames 110 which are conductively coupled to, respectively, the first and second metallization bands 112 and 114. The first conductive lead frame includes a first connector attachable to a first circuit trace of the integrated circuit and second connector attachable to a second circuit trace of the integrated circuit such that the first conductive lead frame conductively couples the first circuit trace to the second circuit trace. Similarly, the second conductive lead frame includes a first connector attachable to a third circuit trace of the integrated circuit and a second connector attachable to a fourth circuit trace of the integrated circuit such that the second conductive lead frame conductively couples the third circuit trace to the fourth circuit trace. However, in one embodiment shown herein (FIGS. 35a–35c), the first and second metallization bands form, respectively, the first and second lead frames.

Moreover, the first and second sets of electrode plates are disposed within the casing in generally parallel relation. The first conductive lead frame lies generally perpendicular to the first set of electrode plates, and the second conductive lead frame lies generally perpendicular to the second set of electrode plates. One of the sets of electrode plates comprises ground electrode plates for the capacitor. The other set of electrode plates comprises active electrode plates for the capacitor. The conductive lead frame 110 conductively coupled to the ground electrode plates is, in turn, conductively coupled to ground (or floating ground-isolated) traces of the integrated circuit. The conductive lead frame, on the other hand, conductively coupled to the active electrode plates is, in turn, conductively coupled to the active traces of the integrated circuit.

It will be appreciated that chip capacitors 108 incorporating the novel lead frames 110 of the present invention route the output (or input) current of an electronic device through the capacitor itself. This technique turns the capacitor from a two terminal device into a four terminal network, which acts as a transmission line. The advantages of the novel capacitor transmission lead frame 110 include reduction or complete elimination of the capacitor external inductance due to leads and connection techniques, reduction in ESR due to the efficient electrode geometry and method of routing circuit input (or output) circuit through the capacitor, and greatly improved RF performance at high frequency. The unique configurations of the capacitor transmission line lead frame gives a designer the ability to place the capacitor at strategic locations on a substrate near the point of lead ingress or egress.

A feature of the invention is that the input or output current of the electronic circuit or device must pass:through the lead frame itself. This is very unlike a conventional capacitor which conducts no current (other than charging current) in a DC circuit application, or conducts only capacitor reactive current in an AC application. Since the novel capacitor lead frame as described herein turns the chip capacitor into a four terminal device, the lead frame must carry the entire current. Accordingly, the lead frame 110 must be sized as to thickness, length, and width so as to carry the output current or input current without heating or fusing.

Although several embodiments of the invention have been described in detail for purposes of illustration, various modifications may be made without departing from the spirit and scope of the invention. Accordingly, the invention is not to be limited, except as by the appended claims.

What is claimed is:

1. A capacitor conductively coupled to circuit traces of an integrated circuit to provide a four terminal network, the capacitor comprising:
   a casing of dielectric material having first and second sets of electrode plates disposed therein;
   a first metallization band disposed along one side of the casing and conductively coupled to the first set of electrode plates;
   a second metallization band disposed along another side of the casing and conductively coupled to the second set of electrode plates;
   a first conductive lead frame conductively coupled to the first metallization band, the first conductive lead frame including a first connector attachable to a first circuit trace of an integrated circuit, and a second connector attachable to a second circuit trace of the integrated circuit, such that the first conductive lead frame conductively couples the first circuit trace to the second circuit trace; and
   a second conductive lead frame conductively coupled to the second metallization band, the second conductive lead frame including a first connector attachable to a third circuit trace of the integrated circuit, and a second connector attachable to a fourth circuit trace of the integrated circuit, such that the second conductive lead frame conductively couples the third circuit trace to the fourth circuit trace;
   wherein at least one of the connectors for the conductive lead frames comprises a pin for through-hole mounting to the integrated circuit, and wherein at least one of the conductive lead frames includes additional connectors for attachment to a capacitor-supporting substrate, make no electrical connection to any point or circuit of the substrate.

2. The capacitor of claim 1, wherein the first and second sets of electrode plates are disposed within the casing in generally parallel relation, the first conductive lead frame lies generally perpendicular to the first set of electrode plates, and wherein the second conductive lead frame lies generally perpendicular to the second set of electrode plates.

3. The capacitor of claim 1, wherein one of the sets of electrode plates comprises ground electrode plates for the capacitor, the other set of electrode plates comprises active electrode plates for the capacitor, the conductive lead frame conductively coupled to said ground electrode plates is, in turn, conductively coupled to ground traces of the integrated circuit, and wherein the conductive lead frame conductively coupled to said active electrode plates is, in turn, conductively coupled to active traces of the integrated circuit.

4. A chip capacitor conductively coupled to spaced-apart, non-conductively coupled circuit traces of an integrated circuit to provide a four terminal network, the chip capacitor comprising:
   a casing of dielectric material having first and second sets of electrode plates disposed therein;
   a first metallization band disposed along one side of the casing and conductively coupled to the first set of electrode plates;
   a second metallization band disposed along another side of the casing and conductively coupled to the second set of electrode plates;
   a first conductive lead frame conductively coupled to the first metallization band, the first conductive lead frame including a first connector attachable to a first circuit trace of the integrated circuit, and a second connector attachable to a second circuit trace of the integrated circuit, such that the first conductive lead frame conductively couples the first circuit trace to the second circuit trace; and
   a second conductive lead frame conductively coupled to the second metallization band, the second conductive lead frame including a first connector attachable to a third circuit trace of the integrated circuit, and a second connector attachable to a fourth circuit trace of the integrated circuit, such that the second conductive lead frame conductively couples the third circuit trace to the fourth circuit trace;
   wherein at least one of the connectors for the conductive lead frames comprises a pin for through-hole mounting to the integrated circuit, a flush tab for substrate mounting onto the integrated circuit, fold under tabs for surface mounting onto the integrated circuit, or mounting tabs spaced from a capacitor-supporting surface of the integrated circuit.

5. The capacitor of claim 4, wherein the first and second sets of electrode plates are disposed within the casing in generally parallel relation, the first conductive lead frame lies generally perpendicular to the first set of electrode plates, and wherein the second conductive lead frame lies generally perpendicular to the second set of electrode plates.

6. The capacitor of claim 4, wherein one of the sets of electrode plates comprises ground electrode plates for the capacitor, the other set of electrode plates comprises active electrode plates for the capacitor, the conductive lead frame conductively coupled to said ground electrode plates is, in turn, conductively coupled to ground traces of the integrated circuit, and wherein the conductive lead frame conductively coupled to said active electrode plates is, in turn, conductively coupled to active traces of the integrated circuit.

7. A chip capacitor conductively coupled to spaced-apart, non-conductively coupled circuit traces of an integrated circuit to provide a four terminal network, the chip capacitor comprising:
   a casing of dielectric material having first and second sets of electrode plates disposed therein;
   a first metallization band disposed along one side of the casing and conductively coupled to the first set of electrode plates;
   a second metallization band disposed along another side of the casing and conductively coupled to the second set of electrode plates;
   a first conductive lead frame conductively coupled to the first metallization band, the first conductive lead frame including a first connector attachable to a first circuit trace of the integrated circuit, and a second connector attachable to a second circuit trace of the integrated circuit, such that the first conductive lead frame conductively couples the first circuit trace to the second circuit trace; and
   a second conductive lead frame conductively coupled to the second metallization band, the second conductive lead frame including a first connector attachable to a third circuit trace of the integrated circuit, and a second connector attachable to a fourth circuit trace of the integrated circuit, such that the second conductive lead frame conductively couples the third circuit trace to the fourth circuit trace;
   wherein at least one of the conductive lead frames includes additional connectors for attachment to a capacitor-supporting substrate, wherein the additional connectors make no electrical connection to any point or circuit of the substrate.

* * * * *

UNITED STATES PATENT AND TRADEMARK OFFICE
CERTIFICATE OF CORRECTION

PATENT NO.    : 6,473,291 B1
DATED         : October 29, 2002
INVENTOR(S)   : Robert A. Stevenson It is certified that error appears in the above-identified patent and that said Letters Patent is hereby corrected as shown below:

<u>Title page,</u>
Item [73], change the name of the Assignee from "GB Acquisition Co., Inc." to
-- Greatbatch-Sierra, Inc. --

Signed and Sealed this

Twenty-second Day of July, 2003

JAMES E. ROGAN
*Director of the United States Patent and Trademark Office*